(12) United States Patent
Muramatsu et al.

(10) Patent No.: US 8,223,318 B2
(45) Date of Patent: Jul. 17, 2012

(54) ILLUMINATING OPTICAL APPARATUS, EXPOSURE APPARATUS AND DEVICE MANUFACTURING METHOD

(75) Inventors: Kouji Muramatsu, Belmont, CA (US); Hisashi Nishinaga, Saitama (JP)

(73) Assignee: Nikon Corporation, Tokyo (JP)

( * ) Notice: Subject to any disclaimer, the term of this patent is extended or adjusted under 35 U.S.C. 154(b) by 740 days.

(21) Appl. No.: 12/243,393

(22) Filed: Oct. 1, 2008

(65) Prior Publication Data
US 2009/0086186 A1    Apr. 2, 2009

Related U.S. Application Data

(63) Continuation of application No. PCT/JP2007/063549, filed on Jul. 6, 2007.

(30) Foreign Application Priority Data

Jul. 7, 2006  (JP) ................................ 2006-188052

(51) Int. Cl.
    *G03B 27/32*    (2006.01)
    *G03B 27/42*    (2006.01)
    *G03B 27/54*    (2006.01)
    *G03B 27/72*    (2006.01)

(52) U.S. Cl. ................ 355/71; 355/53; 355/67; 355/77

(58) Field of Classification Search ............... 250/492.2; 355/46, 53, 67, 71, 77; 359/618–628
See application file for complete search history.

(56) References Cited

U.S. PATENT DOCUMENTS

| | | | |
|---|---|---|---|
| 5,673,103 A * | 9/1997 | Inoue et al. .................. 355/71 |
| 6,730,925 B1 * | 5/2004 | Ozawa .......................... 250/548 |
| 6,741,394 B1 | 5/2004 | Tanitsu et al. |
| 6,913,373 B2 | 7/2005 | Tanaka et al. |
| 6,934,009 B2 | 8/2005 | Terashi |
| 2002/0093718 A1 * | 7/2002 | Slack et al. .................... 359/246 |
| 2002/0196629 A1 | 12/2002 | Terashi |
| 2004/0263817 A1 | 12/2004 | Tanitsu et al. |
| 2006/0221453 A1 | 10/2006 | Koehler et al. |
| 2007/0146676 A1 * | 6/2007 | Tanitsu et al. .................... 355/71 |
| 2007/0258077 A1 * | 11/2007 | Tanaka et al. .................... 355/71 |
| 2008/0074631 A1 | 3/2008 | Kita |
| 2008/0259440 A1 | 10/2008 | Omura |

FOREIGN PATENT DOCUMENTS

| | | |
|---|---|---|
| JP | A-06-053120 | 2/1994 |
| JP | A-07-142338 | 6/1995 |
| JP | A-11-111601 | 4/1999 |

(Continued)

*Primary Examiner* — Hung Henry Nguyen
*Assistant Examiner* — Colin Kreutzer
(74) *Attorney, Agent, or Firm* — Oliff & Berridge, PLC

(57) ABSTRACT

An illumination optical apparatus is able to quickly perform switching between polarization states of illumination light in a first region and in a second region. The illumination optical apparatus of the present invention for illuminating a surface to be illuminated on the basis of light from a light source is provided with an optical integrator of a wavefront division type arranged in an optical path between the light source and the surface to be illuminated and including a plurality of wavefront division regions; and a polarization changing member for changing a polarization state of at least one beam out of a beam incident to a first region in the wavefront division regions of the optical integrator and a beam incident to a second region in the wavefront division regions of the optical integrator.

27 Claims, 17 Drawing Sheets

FOREIGN PATENT DOCUMENTS

| | | |
|---|---|---|
| JP | A-2000-021742 | 1/2000 |
| JP | A-2000-021748 | 1/2000 |
| JP | A-2001-135560 | 5/2001 |
| JP | A-2002-359176 | 12/2002 |
| JP | A-2005-005521 | 1/2005 |
| WO | WO 2005/026822 A2 | 3/2005 |

* cited by examiner (a)

(b)

(a)

(b)

(a)

(b)

(a)

(b)

(a)

(b)

ILLUMINATING OPTICAL APPARATUS, EXPOSURE APPARATUS AND DEVICE MANUFACTURING METHOD

CROSS-REFERENCE TO RELATED APPLICATIONS

This is a continuation application of a PCT application No. PCT/JP2007/063549 filed on Jul. 6, 2007, claiming the benefit of priorities from Japanese Patent application No. 2006-188052 filed on Jul. 7, 2006, and incorporated by reference in their entirety.

BACKGROUND

1. Field

The present invention relates to illumination optical apparatus, exposure apparatus, and device manufacturing methods and, more particularly, to an illumination optical apparatus suitable for an exposure apparatus for manufacturing such devices as semiconductor devices, imaging devices, liquid-crystal display devices, and thin-film magnetic heads by a lithography process.

2. Description of the Related Art

The photolithography process for manufacturing the semiconductor devices and others is carried out using an exposure apparatus for projecting a pattern image of a mask (or reticle) through a projection optical system onto a photosensitive substrate (a wafer, a glass plate, or the like coated with a photoresist) to effect an exposure thereof. The ordinary exposure apparatus is arranged to form a pattern of one kind in one shot area (unit exposure region) on the photosensitive substrate.

In contrast to it, a method proposed for improvement in throughput is a double exposure method of effecting exposures of patterns of two kinds in a superimposed state in one shot area on a photosensitive substrate to form one synthetic pattern (cf. Japanese Patent Application Laid-open No. 2000-21748).

The exposure apparatus of the double exposure method is arranged, for example, as follows: a first pattern region on the mask is illuminated to transfer a pattern in the first pattern region into one shot area on the photosensitive substrate, and thereafter a second pattern region on the mask is illuminated to transfer a pattern in the second pattern region into the same shot area on the photosensitive substrate. In order to improve the throughput of the exposure apparatus, it is necessary to quickly perform switching between polarization states of illumination light in the first pattern region and in the second pattern region according to characteristics of the patterns.

SUMMARY

An object of the present invention is to provide an illumination optical apparatus capable of quickly performing the switching between the polarization states of illumination light in the first region and in the second region. Another object of the present invention is to provide an exposure apparatus capable of performing an exposure of a microscopic pattern at high throughput on a photosensitive substrate by the double exposure method, using the illumination optical apparatus capable of quickly performing the switching between polarization states of illumination light in the first region and in the second region.

A first embodiment of the present invention provides an illumination optical apparatus for illuminating a surface to be illuminated, comprising:

an optical integrator of a wavefront division type arranged in an optical path of the illumination optical apparatus and including a plurality of wavefront division regions; and a polarization changing member for changing a polarization state of at least one beam out of a beam incident to a first region in the wavefront division regions of the optical integrator and a beam incident to a second region in the wavefront division regions of the optical integrator.

A second embodiment of the present invention provides an exposure apparatus comprising the illumination optical apparatus of the first aspect and adapted to perform an exposure of a predetermined pattern illuminated by the illumination optical apparatus, on a photosensitive substrate.

A third embodiment of the present invention provides a device manufacturing method comprising: an exposure step of effecting the exposure of the predetermined pattern on the photosensitive substrate, using the exposure apparatus of the second embodiment; and a development step of developing the photosensitive substrate after the exposure step.

BRIEF DESCRIPTION OF THE DRAWINGS

A general architecture that implements the various features of the invention will now be described with reference to the drawings. The drawings and the associated descriptions are provided to illustrate embodiments of the invention and not to limit the scope of the invention.

DESCRIPTION OF THE EMBODIMENTS

Figure 1:
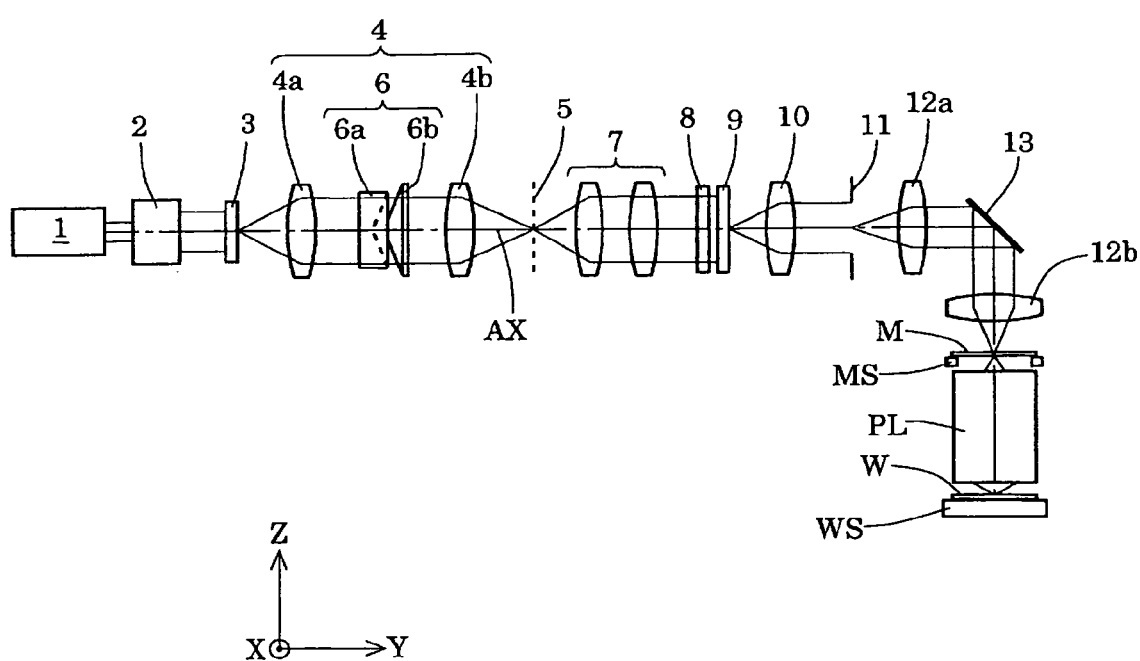
FIG. 1 is a drawing schematically showing a configuration of an exposure apparatus according to an embodiment of the present invention.

Embodiments of the present invention will be described on the basis of the accompanying drawings. FIG. 1 is a drawing schematically showing a configuration of an exposure apparatus according to an embodiment of the present invention. In FIG. 1, the Z-axis is set along a direction of a normal to a wafer W being a photosensitive substrate, the Y-axis along a direction parallel to the plane of FIG. 1 in a surface of the wafer W, and the X-axis along a direction of a normal to the plane of FIG. 1 in the surface of the wafer W. With reference to FIG. 1, the exposure apparatus of the present embodiment is provided with a light source 1 for supplying exposure light (illumination light).

The light source 1 applicable herein is, for example, an ArF excimer laser light source for supplying light with the wavelength of about 193 nm or a KrF excimer laser light source for supplying light with the wavelength of about 248 nm. A beam emitted along the optical axis AX from the light source 1 is expanded into a beam of a required sectional shape by a shaping optical system 2 and the expanded beam travels through a diffractive optical element 3 for annular illumination to enter an afocal lens 4. The diffractive optical element 3 is arranged so as to be able to be set in or off an illumination optical path, and can be replaced with another diffractive optical element for forming a different light intensity distribution in its far field.

The afocal lens 4 is an afocal system (afocal optic) so set that a front focus position of its front lens unit 4a approximately agrees with the position of the diffractive optical element 3 and that a rear focus position of its rear lens unit 4b approximately agrees with a position of a predetermined plane 5 indicated by a dashed line in the drawing. In general, a diffractive optical element is constructed by forming level differences with a pitch nearly equal to the wavelength of the exposure light (illumination light) in a substrate, and has an action to diffract an incident beam at desired angles.

Specifically, the diffractive optical element 3 for annular illumination has such a function that when a parallel beam with a rectangular cross section is incident thereto, it forms an annular light intensity distribution in its far field (or Fraunhofer diffraction region). Therefore, the nearly parallel beam incident into the diffractive optical element 3 forms an annular light intensity distribution on the pupil plane of the afocal lens 4 and thereafter is emitted in an annular angle distribution from the afocal lens 4. In the optical path between the front lens unit 4a and the rear lens unit 4b, a conical axicon system 6 is located on or near the pupil plane of the afocal lens 4. A configuration and action of the conical axicon system 6 will be described later.

The beam from the afocal lens 4 travels through a zoom lens (variable-power optical system) 7 for variation in a value (σ value=mask-side numerical aperture of the illumination system/mask-side numerical aperture of the projection optical system) and through a polarization changing member 8 to enter a micro fly's eye lens (or fly's eye lens) 9. The micro fly's eye lens 9 is an optical system consisting of a large number of micro-lenses with a positive refracting power arrayed vertically and horizontally and densely. In general, a micro fly's eye lens is constructed, for example, by forming the micro-lens group in a plane-parallel plate by etching.

Each micro-lens forming the micro fly's eye lens is smaller than each lens element forming the fly's eye lens. The micro fly's eye lens is different from the fly's eye lens consisting of lens elements isolated from each other, in that the large number of micro-lenses (micro refracting surfaces) are integrally formed without being isolated from each other. However, the micro fly's eye lens is an optical integrator of a wavefront division type as the fly's eye lens is, in that the lens elements with the positive refracting power are arranged vertically and horizontally. Concerning the micro fly's eye lens of this type, reference can be made, for example, to U.S. Pat. Nos. 6,741,394, 6,913,373, and U.S. Pat. Published Application No. 2008/0074631. The teachings of U.S. Pat. Nos. 6,741,394, 6,913,373, and U.S. Pat. Published Application No. 2008/0074631 are incorporated herein by reference.

Figure 2:
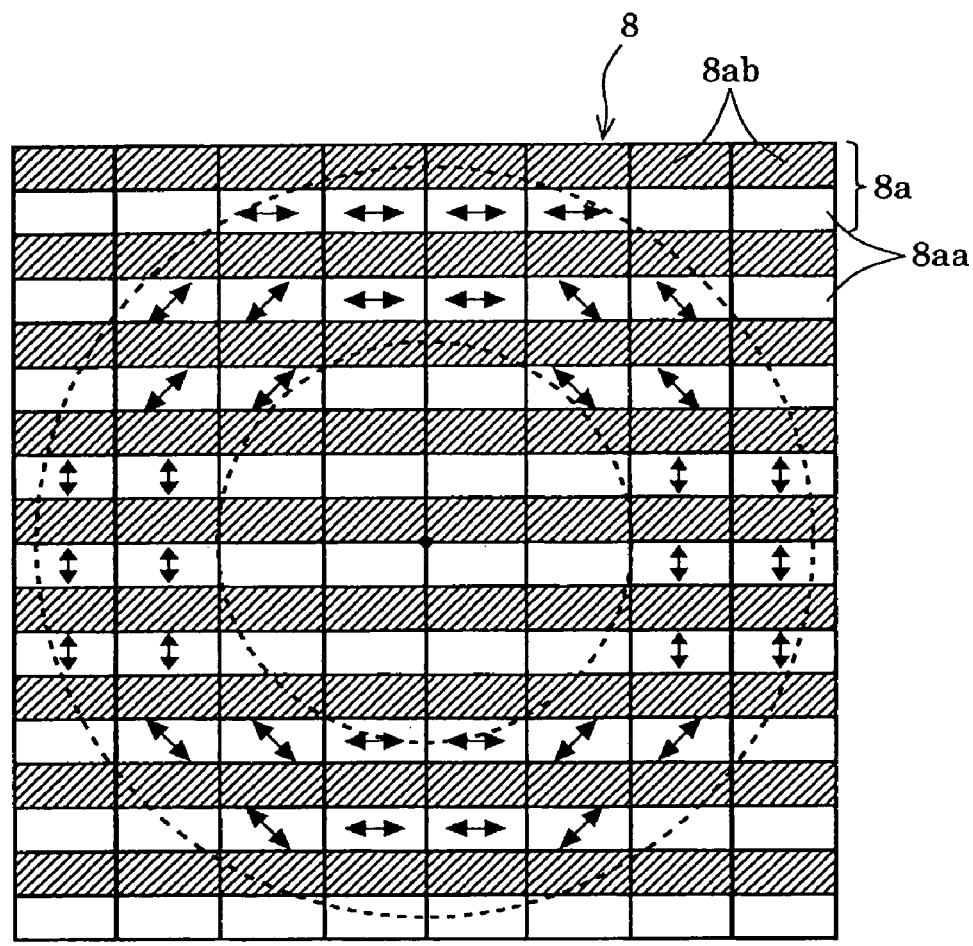
FIG. 2 is a drawing schematically showing a configuration of a polarization changing member.
Figure 2:
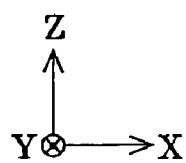
Figure 3:
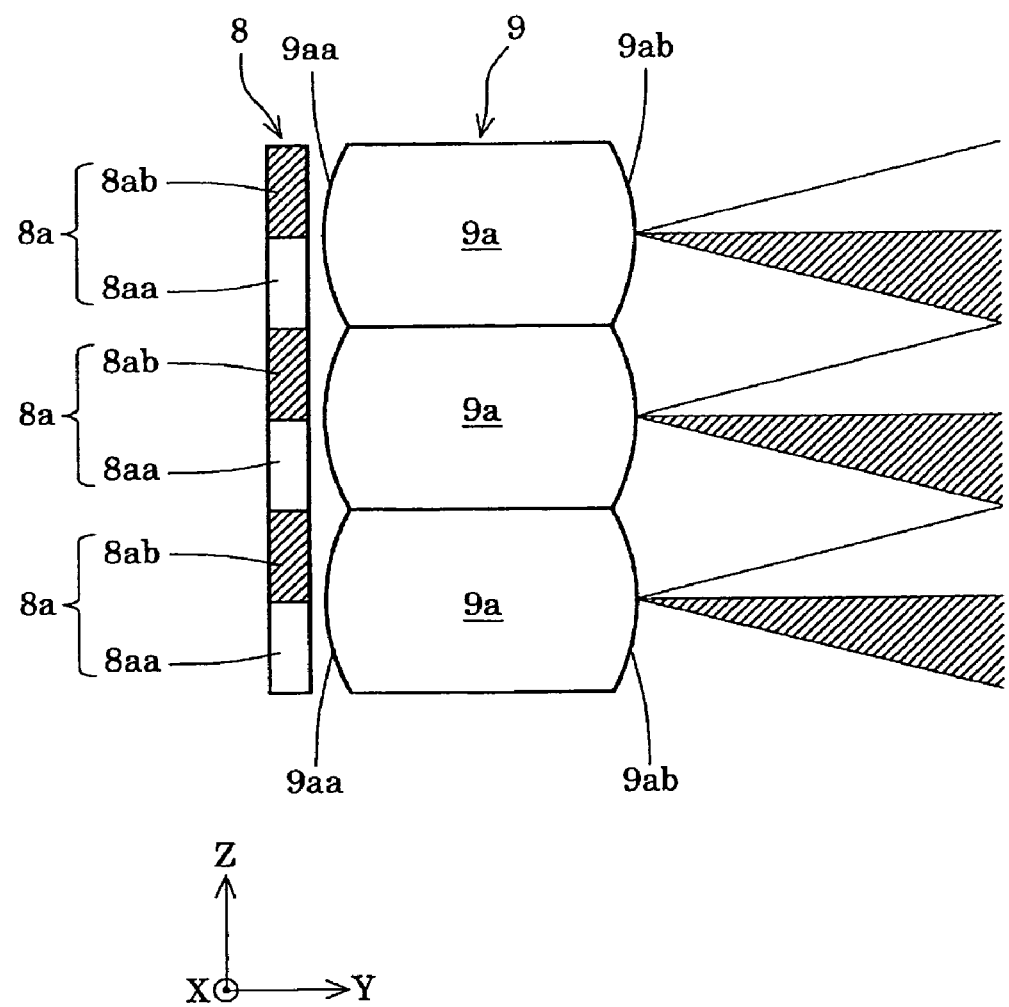
FIG. 3 is a drawing showing a correspondence relation between optical elements forming the polarization changing member and microlenses forming a micro fly's eye lens.

FIG. 2 is a drawing schematically showing a configuration of the polarization changing member. FIG. 3 is a drawing showing a correspondence relation between each optical element forming the polarization changing member and each micro-lens forming the micro fly's eye lens. Referring to FIGS. 2 and 3, the polarization changing member 8 is arranged immediately before the entrance surface of the micro fly's eye lens 9 and is composed of a plurality of subunits 8a arranged vertically and horizontally and densely corresponding to entrance faces (wavefront division regions) 9aa of the micro-lenses 9a forming the micro fly's eye lens 9. For clarity of the drawing, however, FIG. 2 is depicted with the number of subunits 8a and, therefore, the number of micro-lenses 9a forming the micro fly's eye lens 9 much smaller than the actual number.

A subunit 8a has an optically active (optical rotatory) element (first optical element) 8aa arranged so as to correspond to a half region (first region) on the lower side (−Z-direction side) in the drawing in the entrance face 9aa of the micro-lens 9a and having a rectangular contour elongated along the X-direction, and a depolarizer (depolarizing element; depolarization element: second optical element) 8ab arranged so as to correspond to a half region (second region) on the upper side (+Z-direction side) in the drawing in the entrance face 9aa of the micro-lens 9a and having a rectangular contour elongated along the X-direction. The depolarizer 8ab has a function to convert linearly polarized, incident light into substantially unpolarized light and emit the unpolarized light. On the other hand, the optically active element (optical rotator) 8aa has a function to provide linearly polarized, incident light with a required optical rotatory angle and emit the rotated light.

Figure 4:
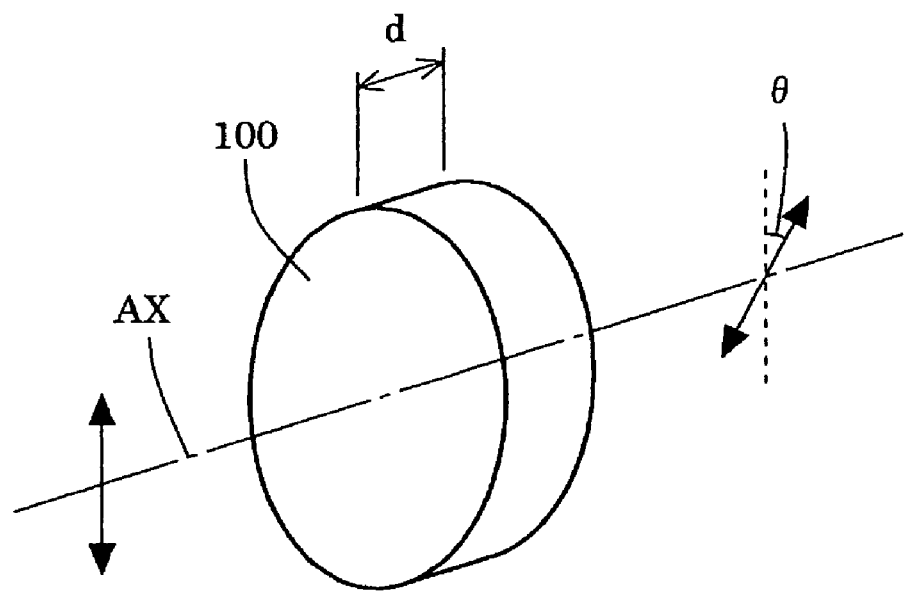
FIG. 4 is a drawing briefly illustrating the optical activity of rock crystal.

Each optically active element 8aa is made of rock crystal being an optical material with optical activity and is so set that its crystal optic axis is approximately coincident with the optical axis AX. The below will briefly describe the optical activity of rock crystal with reference to FIG. 4. Referring to FIG. 4, an optical member 100 of a plane-parallel plate shape made of rock crystal with a thickness d is so arranged that its crystal optic axis is coincident with the optical axis AX. In this case, linearly polarized light incident to the optical member 100 is subjected to the optical activity thereof and is emitted in a state in which the polarization direction thereof is rotated by θ around the optical axis AX. At this time, the angle of rotation (optical rotatory angle) θ of the polarization direction by the optical activity of the optical member 100 is represented by Eq (1) below, using the thickness d of the optical member 100 and the rotatory power ρ of rock crystal.

$$\theta = d \cdot \rho \tag{1}$$

In general, the rotatory power ρ of rock crystal has a wavelength dependence (a property of varying values of optical activity dependent upon wavelengths of used light: optical rotatory dispersion) and, specifically, it tends to increase with decrease in the wavelength of used light. According to the description on page 167 in "Oyo Kogaku (Applied Optics) II," the optical activity ρ of rock crystal for light with the wavelength of 250.3 nm is 153.9°/mm. The thickness (length in the optical-axis direction) of each optically active element 8aa is set according to the required optical rotatory angle to be given to the linearly polarized, incident light, and this will be described later.

Referring again to FIG. 1, the position of the predetermined plane 5 is set near the front focus position of the zoom lens 7 and the entrance surface of the micro fly's eye lens 9 is located near the rear focus position of the zoom lens 7. In other words, the zoom lens 7 establishes a substantial Fourier transform relation between the predetermined plane 5 and the entrance surface of the micro fly's eye lens 9 and, therefore, it keeps the pupil plane of the afocal lens 4 approximately optically conjugate with the entrance surface of the micro fly's eye lens 9. Therefore, for example, an annular illumination field centered on the optical axis AX is formed on the entrance surface of the micro fly's eye lens 9 as on the pupil plane of the afocal lens 4. Two circles indicated by dashed lines in FIG. 2 represent the annular beam passing through the polarization changing member 8.

Figure 5:
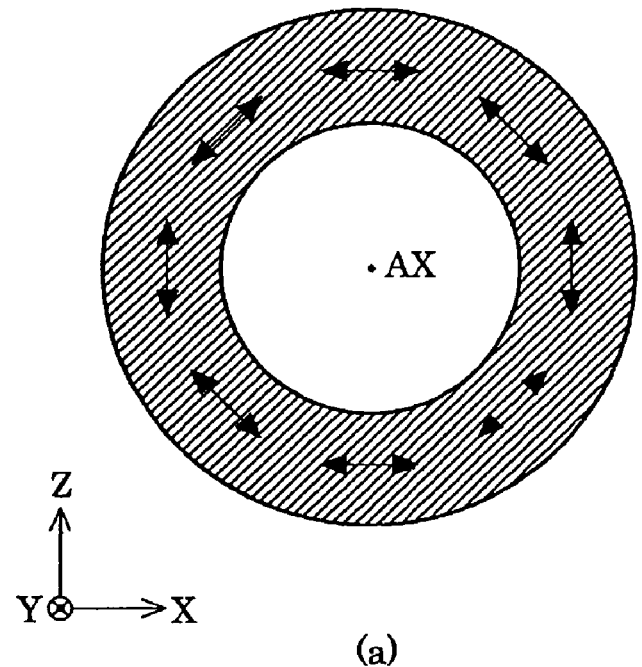
FIG. 5 is a drawing wherein (a) shows a secondary light source in an annular shape and in a circumferentially linearly polarized state formed on an illumination pupil by a first beam and (b) shows a secondary light source in an annular shape and in an unpolarized state formed on the illumination pupil by a second beam.
Figure 5:
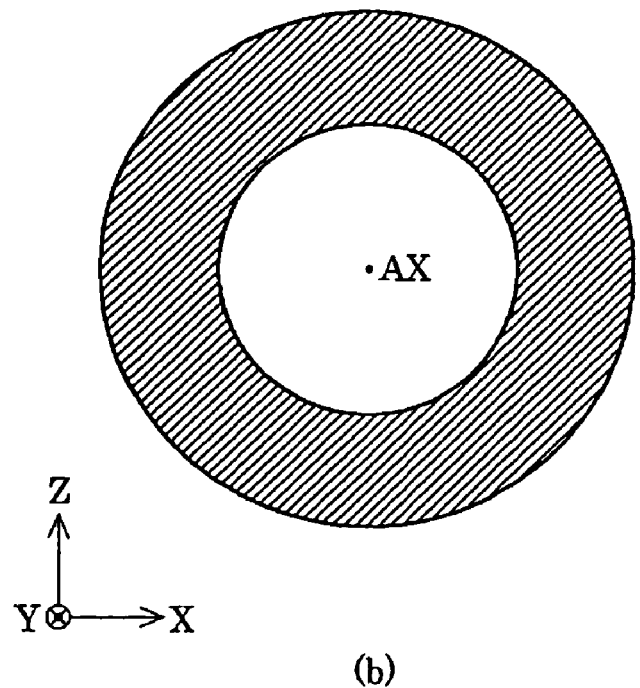

First beams, which have been subjected to the optical rotation action through the respective optically active elements 8aa of the polarization changing member 8 and which have entered the lower (−Z-direction side) half regions in the entrance faces 9aa of the respective micro-lenses 9a of the micro fly's eye lens 9, form a secondary light source with a light intensity distribution approximately identical with an illumination field formed on the entrance surface of the micro fly's eye lens 9, i.e., a secondary light source consisting of a substantial surface illuminant of an annular shape centered on the optical axis AX as shown in FIG. 5 (a), on a rear focal plane of the micro fly's eye lens 9 or on an illumination pupil near it. The first beams passing through the annular secondary light source are in a substantially circumferentially linearly polarized state, as indicated by double-headed arrows for polarization directions of linearly polarized light in FIG. 5 (a).

As described above, the optical rotatory angle of each optically active element 8aa of the polarization changing member 8 is so set that the annular secondary light source formed on the illumination pupil becomes in the circumferentially linearly polarized state. Specifically, for example, when light in a Z-directionally linearly polarized state polarized in the Z-direction is incident to the polarization changing member 8, each optically active element 8aa is arranged to emit linearly polarized light polarized in directions indicated by the double-headed arrows in FIG. 2. Namely, for each optically active element 8aa with an arrow along the X-direction, the thickness thereof is so set that when light in the Z-directionally linearly polarized state with the polarization direction along the Z-direction is incident thereto, it emits light in an X-directionally linearly polarized state with the polarization direction along a direction resulting from +90° rotation of the polarization direction of incident light around the Y-axis, i.e., along the X-direction.

For each optically active element 8aa with an arrow along the Z-direction, the thickness thereof is so set that when light in the Z-directionally linearly polarized state is incident thereto, it emits light in the Z-directionally linearly polarized state with the polarization direction along a direction resulting from +180° rotation of the polarization direction of incident light around the Y-axis, i.e., along the Z-direction. For each optically active element 8aa with an arrow along oblique directions at 45° to the +X-direction and the +Z-direction, the thickness thereof is so set that when light in the Z-directionally linearly polarized state is incident thereto, it emits linearly polarized light polarized in an oblique direction resulting from +45° rotation of the polarization direction of incident light around the Y-axis.

For each optically active element 8aa with an arrow along oblique directions at 45° to the −X-direction and the +Z-direction, the thickness thereof is so set that when light in the Z-directionally linearly polarized state is incident thereto, it emits linearly polarized light polarized in an oblique direction resulting from +135° rotation of the polarization direction of incident light around the Y-axis. The above description schematically shows the simple example in which the polarization changing member 8 has four types of optically active elements 8aa with different thicknesses, but the number of types of optically active elements 8aa can be further increased so that the annular secondary light source shown in FIG. 5 (a) becomes closer to an ideal circumferentially linearly polarized state.

On the other hand, second beams, which have been subjected to the depolarization action through the respective depolarizers 8ab of the polarization changing member 8 and which have entered the upper (+Z-direction side) half regions in the entrance faces 9aa of the respective micro-lenses 9a of the micro fly's eye lens 9, form a secondary light source with a light intensity distribution approximately identical with the illumination field formed on the entrance surface of the micro fly's eye lens 9, i.e., a secondary light source consisting of a substantial surface illuminant of an annular shape centered on the optical axis AX as shown in FIG. 5 (b), on the rear focal plane of the micro fly's eye lens 9 or on the illumination pupil near it. The second beams passing through the annular secondary light source are in a substantially unpolarized state because of the depolarization action of each depolarizer 8ab.

Figure 6:
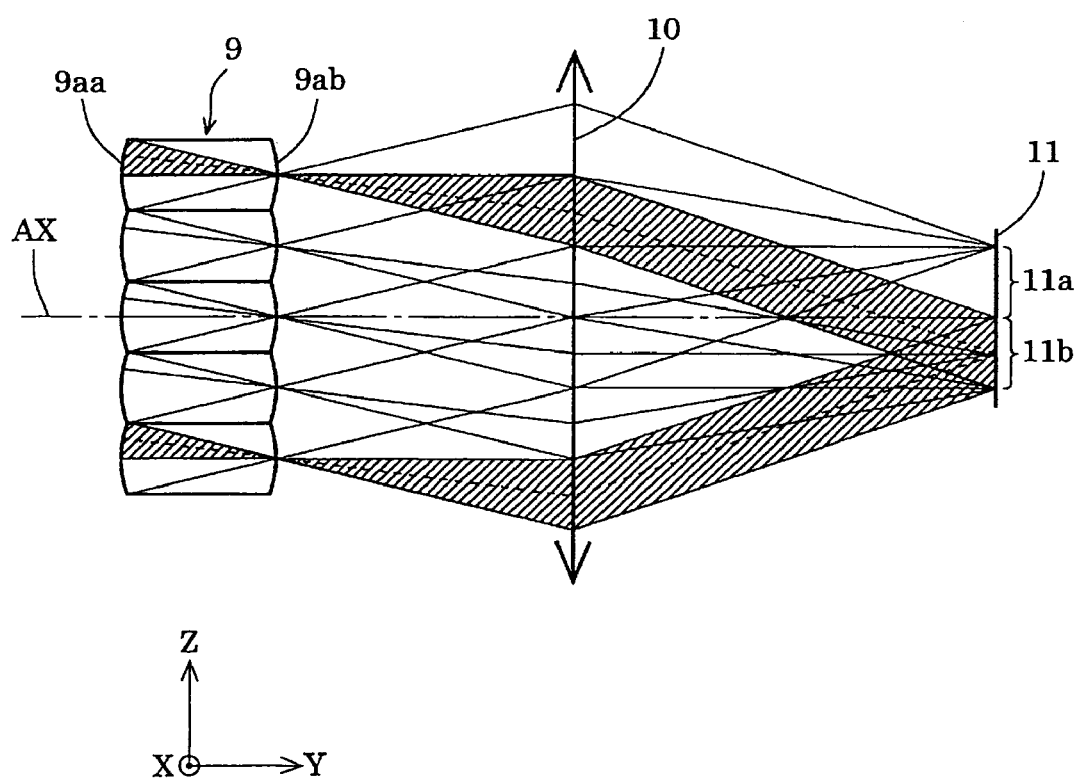
FIG. 6 is a drawing showing a state in which illumination fields are formed in first and second regions on a mask blind by first and second beams having passed through first and second regions on wavefront division regions.

The first beams incident to the lower (−Z-direction side) half regions in the entrance faces 9aa of the respective micro-lenses 9a of the micro fly's eye lens 9, as shown in FIGS. 3 and 6, are emitted obliquely upward in the drawing from exit faces 9ab of the respective micro-lenses 9a to form the secondary light source in the annular shape and in the circumferentially linearly polarized state as shown in FIG. 5 (a), and thereafter they travel through a condenser optical system 10 to superposedly illuminate a mask blind 11. On the other hand, the second beams incident to the upper (+Z-direction side) half regions in the entrance faces 9aa of the respective micro-lenses 9a of the micro fly's eye lens 9, as shown in FIGS. 3 and 6, are emitted obliquely downward in the drawing from the exit faces 9ab of the respective micro-lenses 9a to form the secondary light source in the annular shape and in the unpolarized state as shown in FIG. 5 (b), and thereafter they travel through the condenser optical system 10 to superposedly illuminate the mask blind 11.

On the mask blind 11 as an illumination field stop, an illumination field is formed in a rectangular shape according to the shape of the half region in the entrance face 9*aa* of each micro-lens 9*a* forming the micro fly's eye lens 9. Specifically, the first beam passing through the lower (−Z-direction side) half region in the entrance face 9*aa* of each micro-lens 9*a* forms a first illumination field 11*a* of a rectangular shape elongated in the X-direction on the upper side (+Z-direction side) in the drawing on the mask blind 11, as shown in FIG. 6. On the other hand, the second beam passing through the upper (+Z-direction side) half region in the entrance face 9*aa* of each micro-lens 9*a* forms a second illumination field 11*b* of a rectangular shape elongated in the X-direction on the lower side (−Z-direction side) in the drawing on the mask blind 11, as shown in FIG. 6. The first illumination field 11*a* and the second illumination field 11*b* both have the same shape and size and are in a positional relation in which they are adjacent to each other on both sides of the optical axis AX.

Figure 7:
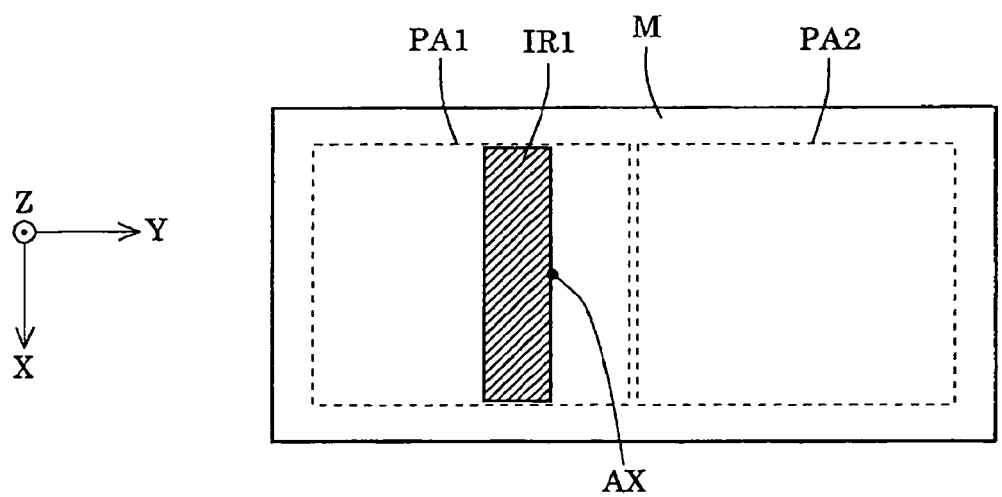
FIG. 7 is a drawing wherein (a) shows a state in which a first illumination region is formed in a first pattern region on a mask by the first beam and (b) shows a state in which a second illumination region is formed in a second pattern region on the mask by the second beam.
Figure 7:
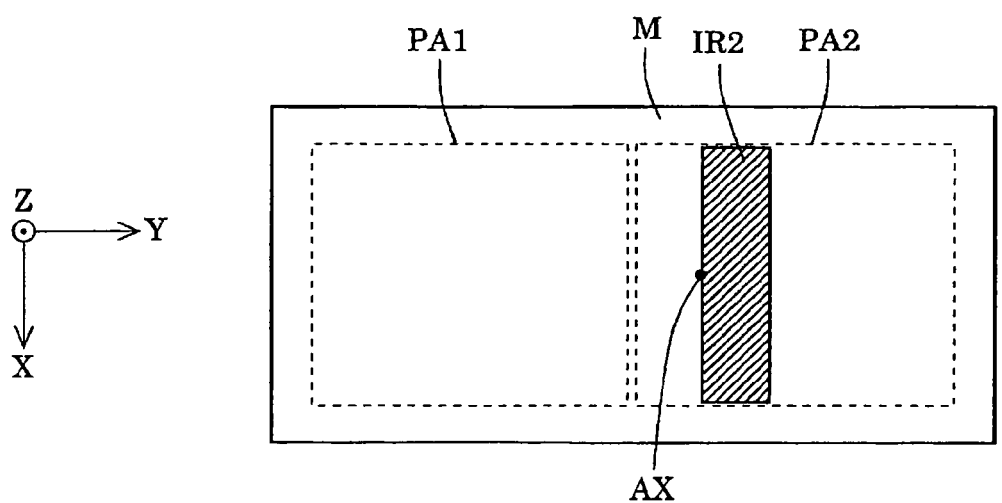

The first beams passing through a rectangular aperture (light transmitting portion) of the mask blind 11 travel via a front lens unit 12*a* of an imaging optical system 12 (the reference symbol of which is not shown), a path folding reflector 13, and a rear lens unit 12*b* of the imaging optical system 12 to superposedly illuminate a first illumination region IR1 of a rectangular shape elongated in the X-direction in a first pattern region PA1 on the mask M, as shown in FIG. 7 (*a*). In this manner, a pattern corresponding to the first illumination region IR1 in the first pattern region PA1 of the mask M is annularly illuminated with the light in the circumferentially linearly polarized state.

The second beams passing through the rectangular aperture of the mask blind 11 travel via the front lens unit 12*a* of the imaging optical system 12, the path folding reflector 13, and the rear lens unit 12*b* of the imaging optical system 12 to superposedly illuminate a second illumination region IR2 of a rectangular shape elongated in the X-direction in a second pattern region PA2 on the mask M, as shown in FIG. 7 (*b*). In this manner, a pattern corresponding to the second illumination region IR2 in the second pattern region PA2 of the mask M is annularly illuminated with the light in the unpolarized state. The first illumination region IR1 and the second illumination region IR2 both have the same shape and size and are in a positional relation in which they are adjacent to each other on both sides of the optical axis AX.

Namely, the first illumination region IR1 and the second illumination region IR2 have the shape corresponding to the half region in the entrance face 9*aa* of each micro-lens 9*a* of the micro fly's eye lens 9. The first beams from the first illumination region IR1 on the mask M held along the XY plane by a mask stage MS, travel through a projection optical system PL to form a pattern image of the first pattern region PA1 on a wafer (photosensitive substrate) W held along the XY plane by a wafer stage WS. The second beams from the second illumination region IR2 on the mask M travel through the projection optical system PL to form a pattern image of the second pattern region PA2 on the wafer W.

In the present embodiment, the first illumination region IR1 is illuminated on the mask M and, while the mask M and the wafer W are synchronously moved along the Y-direction with respect to the projection optical system PL, the pattern in the first pattern region PA1 is transferred into one shot area on the wafer W to effect a scanning exposure thereof. Then the second illumination region IR2 is illuminated on the mask M and, while the mask M and the wafer W are synchronously moved along the Y-direction with respect to the projection optical system PL, the pattern in the second pattern region PA2 is transferred into the same shot area on the wafer W in a state in which it is superimposed over the pattern of the first pattern region PA1, to effect a scanning exposure thereof.

Then the wafer W is two-dimensionally stepped along the XY plane with respect to the projection optical system PL, and the above-described two scanning exposure operations or double exposure operations are repeated to sequentially form a synthetic pattern of the pattern of the first pattern region PA1 and the pattern of the second pattern region PA2 in each of shot areas on the wafer W.

The present embodiment is also applicable to the double exposure method disclosed in Japanese Patent Application Laid-open No. 11-111601. In this double exposure method, first and second patterns are formed on a single reticle, the patterns on the reticle are transferred into first and second shot areas adjacent on a wafer by the scanning exposure method, the wafer is ten stepped by a length of one shot area in the scanning direction, and the patterns on the reticle are transferred into the second and third shot areas on the wafer, thereby effecting double exposures of the first and second patterns in the second shot area. This exposure method permits the illumination conditions for the two patterns to be optimized by changing the illumination conditions in illumination of the first and second patterns in predetermined illumination regions during the scanning exposure. The teachings of Japanese Patent Application Laid-open No. 11-111601 are incorporated herein by reference.

The conical axicon system 6 is composed of the following members arranged in order from the light source side (light entrance side): first prism member 6*a* with a plane on the light source side and with a refracting surface of a concave conical shape on the mask side (light exit side); and second prism member 6*b* with a plane on the mask side and with a refracting surface of a convex conical shape on the light source side. The concave conical refracting surface of the first prism member 6*a* and the convex conical refracting surface of the second prism member 6*b* are complementarily formed so as to butt each other. At least one of the first prism member 6*a* and the second prism member 6*b* is arranged as movable along the optical axis AX to make the spacing variable between the concave conical refracting surface of the first prism member 6*a* and the convex conical refracting surface of the second prism member 6*b*.

In a state in which the concave conical refracting surface of the first prism member 6*a* and the convex conical refracting surface of the second prism member 6*b* butt each other, the conical axicon system 6 functions as a plane-parallel plate, to cause no effect on the annular secondary light source formed. However, as the concave conical refracting surface of the first prism member 6*a* is separated from the convex conical refracting surface of the second prism member 6*b*, the outside diameter (inside diameter) of the annular secondary light source varies, while keeping the width of the annular secondary light source (half of a difference between the outside diameter and the inside diameter of the annular secondary light source) constant. Namely, the separation results in varying the annular ratio (inside diameter/outside diameter) and the size (outside diameter) of the annular secondary light source.

The zoom lens 7 has a function to similarly (isotropically) enlarge or reduce the entire shape of the secondary light source. For example, as the focal length of the zoom lens 7 is increased from a minimum value to a predetermined value, the entire shape of the secondary light source is similarly enlarged. In other words, the action of the zoom lens 7 varies both the width and size (outside diameter), without change in the annular ratio of the annular secondary light source. As described above, the annular ratio and size (outside diameter) of the annular secondary light source can be controlled by the actions of the conical axicon system 6 and the zoom lens 7.

In the present embodiment, the position and size of the aperture of the mask blind 11 are so set that during the scanning exposure of the pattern of the first pattern region PA1, the aperture selectively passes only the first beams having passed through the respective optically active elements 8aa of the polarization changing member 8 and the lower (−Z-direction side) half regions in the entrance faces 9aa of the respective micro-lenses 9a of the micro fly's eye lens 9, to guide them to the mask M. The first beams having passed through the aperture of the mask blind 11 annularly illuminate the first illumination region IR1 in the first pattern region PA1 on the mask M, in the circumferentially linearly polarized state.

Next, the position and size of the aperture of the mask blind 11 are so set that during the scanning exposure of the pattern of the second pattern region PA2, the aperture selectively passes only the second beams having passed through the respective depolarizers 8ab of the polarization changing member 8 and the upper (+Z-direction side) half regions in the entrance faces 9aa of the respective micro-lenses 9a of the micro fly's eye lens 9, to guide them to the mask M. The second beams having passed through the aperture of the mask blind 11 annularly illuminate the second illumination region IR2 in the second pattern region PA2 on the mask M, in the unpolarized state.

In the present embodiment, as described above, a changeover can be made between the annular illumination of the first illumination region IR1 in the circumferentially linearly polarized state and the annular illumination of the second illumination region IR2 in the unpolarized state by performing the simple operation of changing the position of the aperture of the mask blind 11 between the first position where only the first beams are selectively passed and the second position where only the second beams are selectively passed. Namely, the illumination optical apparatus of the present embodiment is able to quickly perform the switching between the polarization states of the illumination light in the first pattern region PA1 and in the second pattern region PA2. As a result, the exposure apparatus of the present embodiment is able to perform the exposures of the microscopic patterns on the mask M with high accuracy and high throughput on the wafer W by the double exposure method, using the illumination optical apparatus capable of quickly performing the switching between the polarization states of the illumination light in the first pattern region PA1 and in the second pattern region PA2.

In general, the exposure apparatus is preferably arranged to illuminate a pattern on a mask M with light in a required linearly polarized state such that the light impinging on the wafer W is in a polarized state in which the principal component is s-polarized light. The s-polarized light herein is linearly polarized light with the polarization direction along a direction normal to a plane of incidence (i.e., polarized light the electric vector of which is vibrating in directions normal to the plane of incidence). The plane of incidence is defined as a plane that includes a point where light reaches a boundary surface of a medium (a surface of a wafer W) and includes a normal to the boundary surface at that point and a direction of incidence of light. When the mask pattern is illuminated with the light in the required linearly polarized state such that the light impinging on the wafer W is in the polarization state with the principal component of s-polarized light, it becomes feasible to improve the optical performance (depth of focus and others) of the projection optical system PL and to obtain a high-contrast pattern image on the wafer W.

In the present embodiment, the pattern corresponding to the first illumination region IR1 is illuminated with the light from the secondary light source in the annular shape and in the circumferentially linearly polarized state as shown in FIG. 5 (a), during the scanning exposure of the pattern of the first pattern region PA1. As a result, the light focused on the wafer W as a final surface to be illuminated from the pattern of the first pattern region PA1 illuminated with the light in the first illumination region IR1 is in the polarization state with the principal component of s-polarized light, whereby a high-contrast pattern image can be obtained on the wafer W. On the other hand, during the scanning exposure of the pattern of the second pattern region PA2, the pattern corresponding to the second illumination region IR2 is illuminated with the light from the secondary light source in the annular shape and in the unpolarized state as shown in FIG. 5 (b). As a result, for example, an image of a supplementary pattern with a relatively large line width in the second pattern region PA2 illuminated with the light in the second illumination region IR2 can be formed well on the wafer W.

In the above-described embodiment, it is also possible to implement any one of circular illumination and multi-pole illuminations (dipole illumination, quadrupole illumination, etc.) by setting a diffractive optical element for circular illumination or a diffractive optical element for multi-pole illumination instead of the diffractive optical element 3 for annular illumination in the illumination optical path. Namely, for example, in an optional illumination form selected from the circular illumination, the multi-pole illuminations, and so on, the first illumination region and the second illumination region can be illuminated in mutually different polarization states. In this case, instead of the conical axicon system 6, a V-groove axicon system (not shown) or a pyramid axicon system (not shown) can be set on or near the pupil plane of the afocal lens 4. The V-groove axicon system has refracting surfaces of a V-sectional shape approximately symmetric with respect to a predetermined axis passing the optical axis, and the pyramid axicon system have refracting surfaces of a shape corresponding to side faces of a pyramid centered on the optical axis. Concerning the configurations and actions of the V-groove axicon system and the pyramid axicon system, reference can be made, for example, to Japanese Patent Application Laid-open No. 2002-231619 and U.S. Pat. Published Application No. 2004/263817 corresponding thereto. The teachings of U.S. Pat. Published Application No. 2004/263817 are incorporated herein by reference.

In the above-described embodiment, the polarization changing member 8 is composed of the plurality of optically active elements 8aa arranged corresponding to the lower (−Z-direction side) half regions (first regions) in the entrance faces 9aa of the micro-lenses 9a forming the micro fly's eye lens 9, and the plurality of depolarizers 8ab arranged corresponding to the upper (+Z-direction side) half regions (second regions). However, without having to be limited to this, the plurality of depolarizers 8ab can be replaced by a plurality of optically active elements. In this case, the second beams having passed through these optically active elements and the upper (+Z-direction side) half regions in the entrance faces 9aa of the micro-lenses 9a are set in an appropriate polarized state except for the circumferentially linearly polarized state, e.g., in an X-directionally linearly polarized state, in a Z-directionally linearly polarized state, or in an obliquely linearly polarized state with the polarization direction between the X-direction and the Z-direction. The above-described embodiment uses the optically active elements (optical rotators) as the optical elements for changing the polarization state of the incident beam in the polarization changing member, but, without having to be limited to this, it is also possible to use wave plates or the like instead of the optically active elements. In general, a polarization changing member is arranged to change a polarization state of at least one beam out of a beam incident to a first region in a wavefront division region and a beam incident to a second region, but a variety of modification examples can be contemplated as to its specific configuration.

In the above-described embodiment, the mask blind 11 selectively passes only the first beams and guides them to the mask M to illuminate the first illumination region IR1 in the first pattern region PA1, thereby effecting the scanning exposure of the pattern of the first pattern region PA1 in one shot area on the wafer W. Then the mask blind 11 selectively passes only the second beams and guides them to the same mask M to illuminate the second illumination region IR2 in the second pattern region PA2, thereby effecting the scanning exposure of the pattern of the second pattern region PA2 in the same shot area on the wafer W in the state in which it is superimposed over the pattern of the first pattern region PA1.

However, without having to be limited to this, it is also possible to adopt a method in which the mask blind 11 simultaneously guides the first beams and the second beams to the mask M to simultaneously illuminate the first illumination region IR1 and the second illumination region IR2 adjacent in one pattern region, thereby effecting scanning exposures of the pattern illuminated with the light from the first illumination region IR1 and the pattern illuminated with the light from the second illumination region IR2, in a superimposed state in one shot area on the wafer W. It is also possible to adopt a method in which the first beams are guided to a first mask to effect a scanning exposure of a pattern of the first mask in one shot area on the wafer W, thereafter the first mask is replaced with a second mask, and the second beams are guided to the second mask to effect a scanning exposure of the pattern of the second mask in a superimposed state in the same shot area on the wafer W.

In the above embodiment, the first beams forming the first illumination region IR1 on the mask M pass through the lower (−Z-direction side) half regions in the entrance faces 9aa of the micro-lenses 9a being the wavefront division regions, and the second beams forming the second illumination region IR2 on the mask M pass through the upper (+Z-direction side) half regions. However, without having to be limited to this, a variety of modification examples can be contemplated as to the division form of regions in each wavefront division region. In a configuration shown in FIG. 8, as an example, a first beam having passed through a central region 9aa1 in the entrance face 9aa of the micro-lens 9a illuminates a first illumination region IR1 centered on the optical axis AX in the pattern region PA on the mask M, and second beams having passed through a pair of peripheral regions 9aa2 on both sides of the central region 9aa1 along the X-direction in the entrance face 9aa illuminate a pair of second illumination regions IR2 on both sides of the first illumination region IR1 along the X-direction in the pattern region PA on the mask M.

Figure 8:
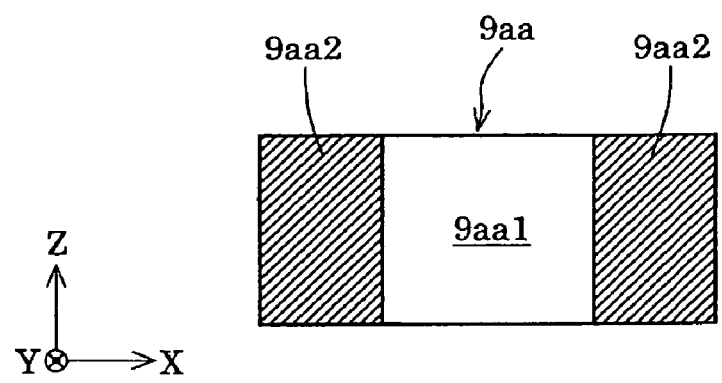
FIG. 8 is a drawing schematically showing a configuration of a first modification example about a division form of regions in each wavefront division region.
Figure 8:
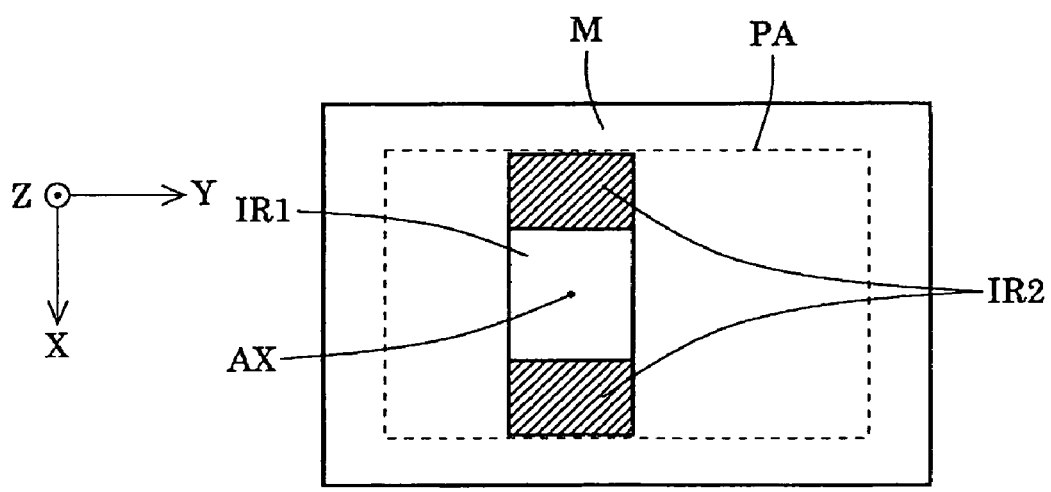

In the configuration example shown in FIG. 8, the polarization changing member 8 not shown herein has an optically active element (or a wave plate, a depolarizer, or the like) arranged corresponding to the central region 9aa1 and has a pair of optically active elements (or wave plates, depolarizers, or the like) arranged corresponding to the pair of peripheral regions 9aa2. In this way, the first illumination region IR1 on the mask M is illuminated in a first polarization state and a pattern in the pattern region PA illuminated with the light in the first illumination region IR1 is transferred into one shot area on the wafer W to effect a scanning exposure thereof. Then the second illumination regions IR2 on the mask M are illuminated in a second polarization state and patterns in the pattern region PA illuminated with the light in the second illumination regions IR2 are transferred over the same shot area on the wafer W to effect a scanning exposure thereof.

Figure 9:
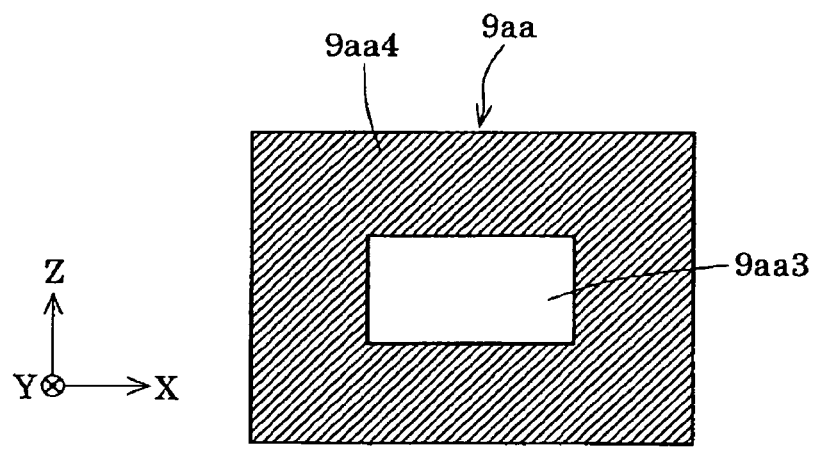
FIG. 9 is a drawing schematically showing a configuration of a second modification example about the division form of regions in each wavefront division region.
Figure 9:
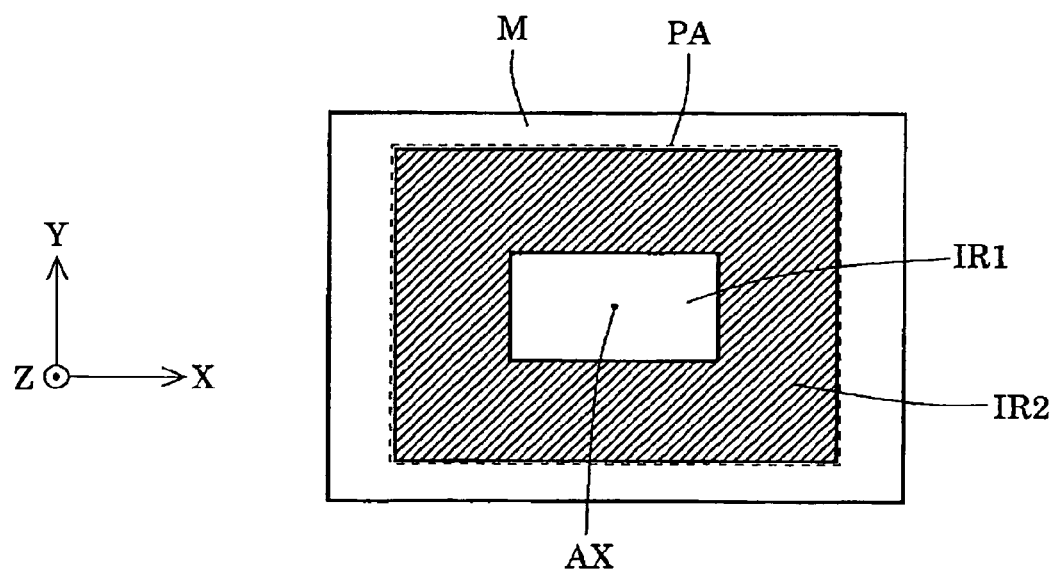

In a configuration shown in FIG. 9, as another example, a first beam having passed through a central region 9aa3 in the entrance face 9aa of the micro-lens 9a illuminates a first illumination region IR1 centered on the optical axis AX in the pattern region PA on the mask M and a second beam having passed through a peripheral region 9aa4 surrounding the central region 9aa3 in the entrance face 9aa illuminates a second illumination region IR2 surrounding the first illumination region IR1 in the pattern region PA on the mask M. In the configuration example shown in FIG. 9, the polarization changing member 8 not shown herein has an optically active element (or a wave plate, a depolarizer, or the like) arranged corresponding to the central region 9aa3 and has an optically active element (or a wave plate, a depolarizer, or the like) arranged corresponding to the peripheral region 9aa4. In this manner, the first illumination region IR1 and the second illumination region IR2 on the mask M are illuminated in different polarization states, and the pattern in the pattern region PA illuminated with the light in the first illumination region IR1 and the pattern in the pattern region PA illuminated with the light in the second illumination region IR2 are transferred into one shot area on the wafer W by one-shot exposure.

In the above embodiment, each of the wavefront division regions has the first region and the second region and the polarization changing member changes the polarization state of at least one beam out of the beam incident to the first region and the beam incident to the second region. However, without having to be limited to this, it is also possible to adopt an example in which the plurality of wavefront division regions include a first wavefront division region and a second wavefront division region, the polarization changing member includes a first polarization changing member and a second polarization changing member, the first polarization changing member changes a polarization state of at least one beam out of a beam incident to a first region in the first wavefront division region and a beam incident to a second region therein, and the second polarization changing member changes a polarization state of at least one beam out of a beam incident to a third region in the second wavefront division region and a beam incident to a fourth region therein. In this configuration example, polarization states on the pupil plane can be set in different states according to positions on the surface to be illuminated.

Figure 10:
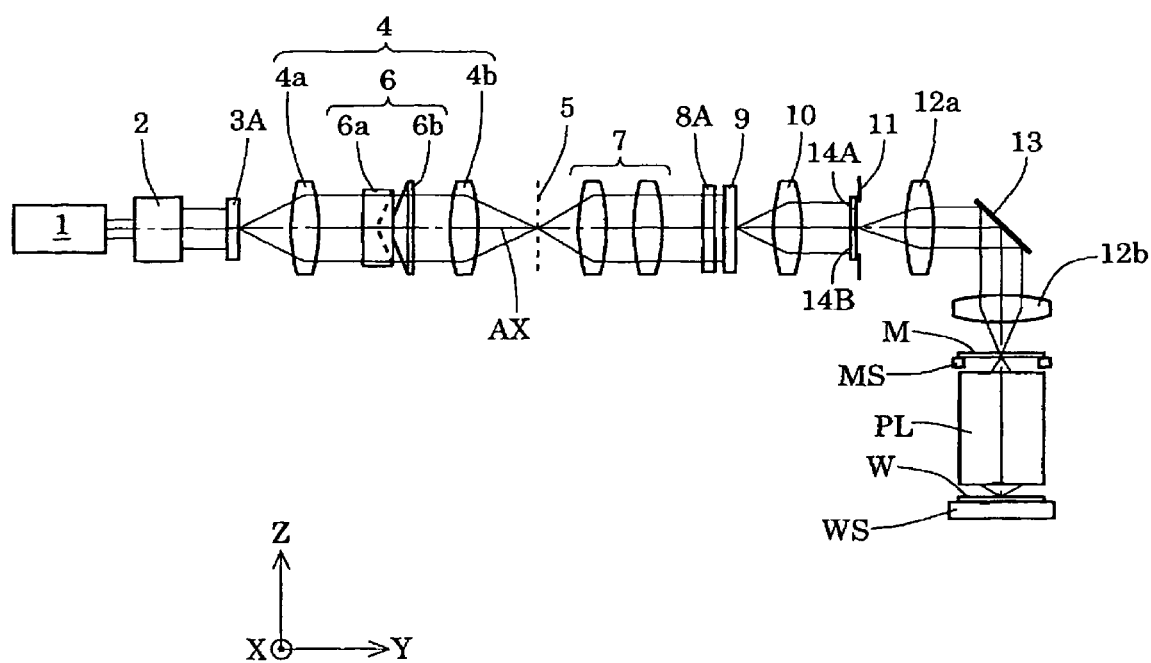
FIG. 10 is a drawing schematically showing a configuration of an exposure apparatus according to a first modification example of the embodiment of the present invention.

FIG. 10 is a drawing schematically showing a configuration of an exposure apparatus according to a first modification example of the embodiment of the present invention. The first modification example in FIG. 10 has the configuration similar to the embodiment of FIG. 1, but is different from the embodiment of FIG. 1 in that a diffractive optical element 3A for circular illumination is used instead of the diffractive optical element 3 for annular illumination and in that a first diffractive optical element 14A is located at the position of incidence of the first beams and a second diffractive optical element 14B is located at the position of incidence of the second beams, immediately before the mask blind 11. In FIG. 10, the elements with the same functionality as the components in the embodiment of FIG. 1 are denoted by the same reference symbols as those in FIG. 1. The configuration and action of the first modification example of FIG. 10 will be described below with focus on the differences from the embodiment of FIG. 1.

In the first modification example, the beam emitted along the optical axis AX from the light source 1 is expanded into a beam of a required sectional shape by the shaping optical system 2 and then the expanded beam is incident to the diffractive optical element 3A for circular illumination. The diffractive optical element 3A for circular illumination has such a function that when a parallel beam with a rectangular cross section is incident thereto, it forms a circular light intensity distribution in its far field (or Fraunhofer diffraction region). Therefore, a nearly parallel beam incident to the diffractive optical element 3A forms a circular light intensity distribution on the pupil plane of the afocal lens 4 and thereafter is emitted in a circular angle distribution from the afocal lens 4.

The beam from the afocal lens 4 travels through the zoom lens 7 to enter a polarization changing member 8A. The polarization changing member 8A has a configuration similar to that of the polarization changing member 8 in FIG. 1, but is different from the polarization changing member 8 in that it has optically active elements (or wave plates or the like) instead of the depolarizers 8ab. In the first modification example, first beams set in an X-directionally linearly polarized state through optically active elements in the polarization changing member 8A arranged corresponding to the optically active elements 8aa in FIG. 2, are incident into the lower (−Z-direction side) half regions in the entrance faces 9aa of the respective micro-lenses 9a of the micro fly's eye lens 9, to form a secondary light source in a circular shape and in the X-directionally linearly polarized state, and then the first beam therefrom travels through the condenser optical system 10 to enter the first diffractive optical element 14A.

The first diffractive optical element 14A divides the first beam incident thereinto, into two beams and deflects the two divided beams at mutually identical angles and along a plane (first plane) including the optical axis AX and being parallel to the YZ plane. The first beams, after divided into the two beams by the first diffractive optical element 14A, pass through the aperture of the mask blind 11 and travel via the imaging optical system 12 to illuminate the first illumination region IR1 of the rectangular shape elongated in the X-direction in the first pattern region PA1 on the mask M. At this time, the first diffractive optical element 14A functions as a distribution changing member that changes a light quantity distribution in angle directions of the first beams incident to the first illumination region IR1.

Figure 11:
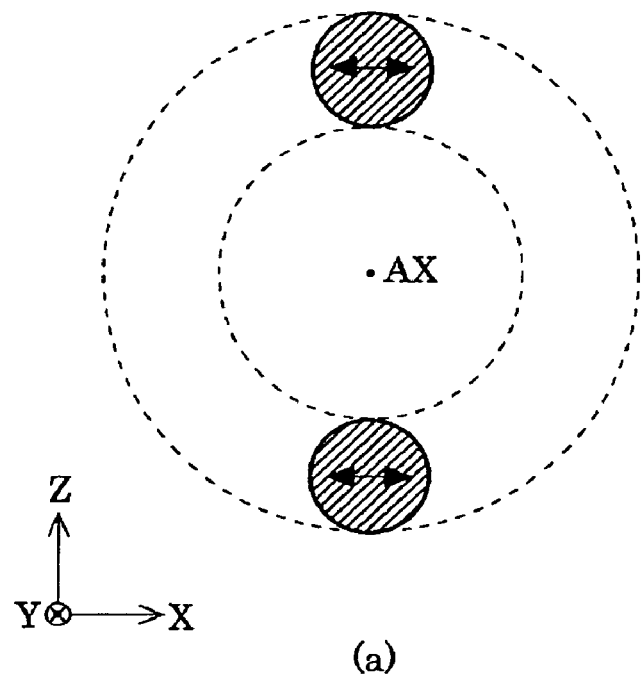
FIG. 11 is a drawing schematically showing a state of a secondary light source.
Figure 11:
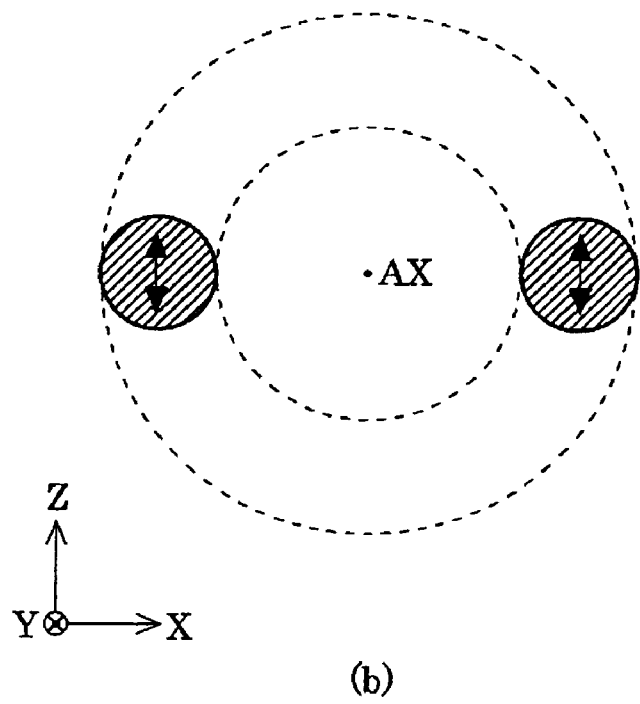

Specifically, without intervention of the first diffractive optical element 14A, the first beams circularly illuminate the pattern corresponding to the first illumination region IR1, with the light in the X-directionally linearly polarized state. In contrast to it, since in the first modification example the first diffractive optical element 14A functions as the distribution changing member, the first beams dipolarly illuminate the pattern corresponding to the first illumination region IR1, with the light in the X-directionally linearly polarized state. This is optically equivalent to such illumination that a secondary light source in a dipole shape and in the X-directionally linearly polarized state consisting of two regions spaced in the Z-direction with respect to the optical axis AX is formed on the rear focal plane of the micro fly's eye lens 9 or on the pupil plane near it, as shown in FIG. 11 (a), and that the first illumination region IR1 is illuminated with light from this secondary light source.

On the other hand, second beams set in the Z-directionally linearly polarized state through the optically active elements in the polarization changing member 8A arranged corresponding to the depolarizers 8ab in FIG. 2 are incident into the upper (+Z-direction side) half regions in the entrance faces 9aa of the respective micro-lenses 9a of the micro fly's eye lens 9 to form a secondary light source in a circular shape and in the Z-directionally linearly polarized state, and then the second beam therefrom travels through the condenser optical system 10 to enter the second diffractive optical element 14B. The second diffractive optical element 14B divides the second beam incident thereinto, into two beams, and deflects the two divided beams at mutually identical angles and along a plane including the optical axis AX and being parallel to the XY plane (i.e., a second plane perpendicular to the first plane).

The second beams, after divided into the two beams by the second diffractive optical element 14B, pass through the aperture of the mask blind 11 and thereafter travel via the imaging optical system 12 to illuminate the second illumination region IR2 of the rectangular shape elongated in the X-direction in the second pattern region PA2 on the mask M. At this time, the second diffractive optical element 14B functions as a distribution changing member that changes a light quantity distribution in angle directions of the second beams incident to the second illumination region IR2. Specifically, without intervention of the second diffractive optical element 14B, the second beams circularly illuminate the pattern corresponding to the second illumination region IR2, with the light in the Y-directionally linearly polarized state.

In contrast to it, since in the first modification example the second diffractive optical element 14B functions as the distribution changing member, the second beams dipolarly illuminate the pattern corresponding to the second illumination region IR2, with the light in the Y-directionally linearly polarized state. This is optically equivalent to such illumination that a secondary light source in a dipole shape and in the Z-directionally linearly polarized state consisting of two regions spaced in the X-direction with respect to the optical axis AX is formed on the rear focal plane of the micro fly's eye lens 9 or on the pupil plane near it, as shown in FIG. 11 (b), and that the second illumination region 12 is illuminated with light from this secondary light source.

In the first modification example, as described above, light focused on the wafer W as a final surface to be illuminated from the X-directional pattern elongated along the X-direction in the pattern in the first pattern region PA1 illuminated with the light in the first illumination region IR1, is in the polarized state with the principal component of s-polarized light, whereby a high-contrast pattern image is obtained on the wafer W. Light focused on the wafer W as the final surface to be illuminated from the Y-directional pattern elongated along the Y-direction in the pattern in the second pattern region PA2 illuminated with the light in the second illumination region IR2, is in the polarized state with the principal component of s-polarized light, whereby a high-contrast pattern image is obtained on the wafer W.

Since in the first modification example the pair of diffractive optical elements 14A, 14B are located at the position approximately optically conjugate with the mask M as the surface to be illuminated, the light diffracted by the diffractive optical elements 14A, 14B is surely guided into the illumination regions. In contrast to it, in a configuration in which the pair of diffractive optical elements 14A, 14B are located immediately before the mask M in the optical path between the imaging optical system 12 and the mask M, part of the light diffracted by the diffractive optical elements 14A, 14B reaches the outside of the illumination regions, to cause so-called illumination blur.

The first modification example of FIG. 10 uses the diffractive optical element 3A for circular illumination and the pair of diffractive optical elements 14A, 14B for dividing the incident beam into two beams, as the distribution changing member for simplicity of description. However, without having to be limited to this, a diffractive optical element for annular illumination, a diffractive optical element for multi-pole illumination, or the like can be set instead of the diffractive optical element 3A for circular illumination in the illumination optical path. It is also possible to move one of the pair of diffractive optical elements 14A, 14B away from the optical path or to replace one or both with a diffractive optical element having another diffraction property.

For example, when the first diffractive optical element 14A is replaced with a diffractive optical element having another diffraction property, the first illumination region IR1 can be substantially annularly illuminated or substantially multi-polarly illuminated except for the dipole illumination, based on the light passing through the diffractive optical element 3A for circular illumination. Similarly, when the second diffractive optical element 14B is replaced with a diffractive optical element having another diffraction property, the second illumination region IR2 can be substantially annularly illuminated or substantially multi-polarly illuminated except for the dipole illumination, based on the light passing through the diffractive optical element 3A for circular illumination. In general, the distribution changing member is located at or near the position optically conjugate with the mask M being the surface to be illuminated, and is arranged to change the light quantity distribution in angle directions of at least one beam out of the first beam incident to the first illumination region IR1 and the second beam incident to the second illumination region IR2, but a variety of modification examples can be contemplated as to its specific configuration.

In the embodiment of FIG. 1 and the first modification example of FIG. 10, the first beam incident to the first region in each wavefront division region of the micro fly's eye lens 9 and the second beam incident to the second region in each wavefront division region of the micro fly's eye lens 9 are guided via the common condenser optical system 10 and the common imaging optical system 12 to the first illumination region IR1 and to the second illumination region IR2, respectively, on the common mask M. However, without having to be limited to this, it is also possible to use a first lightguide optical system for guiding the first beam passing through the first region in each wavefront division region, to the first illumination region and a second lightguide optical system for guiding the second beam passing through the second region in each wavefront division region, to the second illumination region. Furthermore, as shown in a second modification example of FIG. 12, it is also possible to guide the first beam through the first lightguide optical system to a first illumination region IR1 (not shown in FIG. 2) on a first mask M1 and to guide the second beam through the second lightguide optical system to a second illumination region IR2 (not shown in FIG. 12) on a second mask M2.

Figure 12:
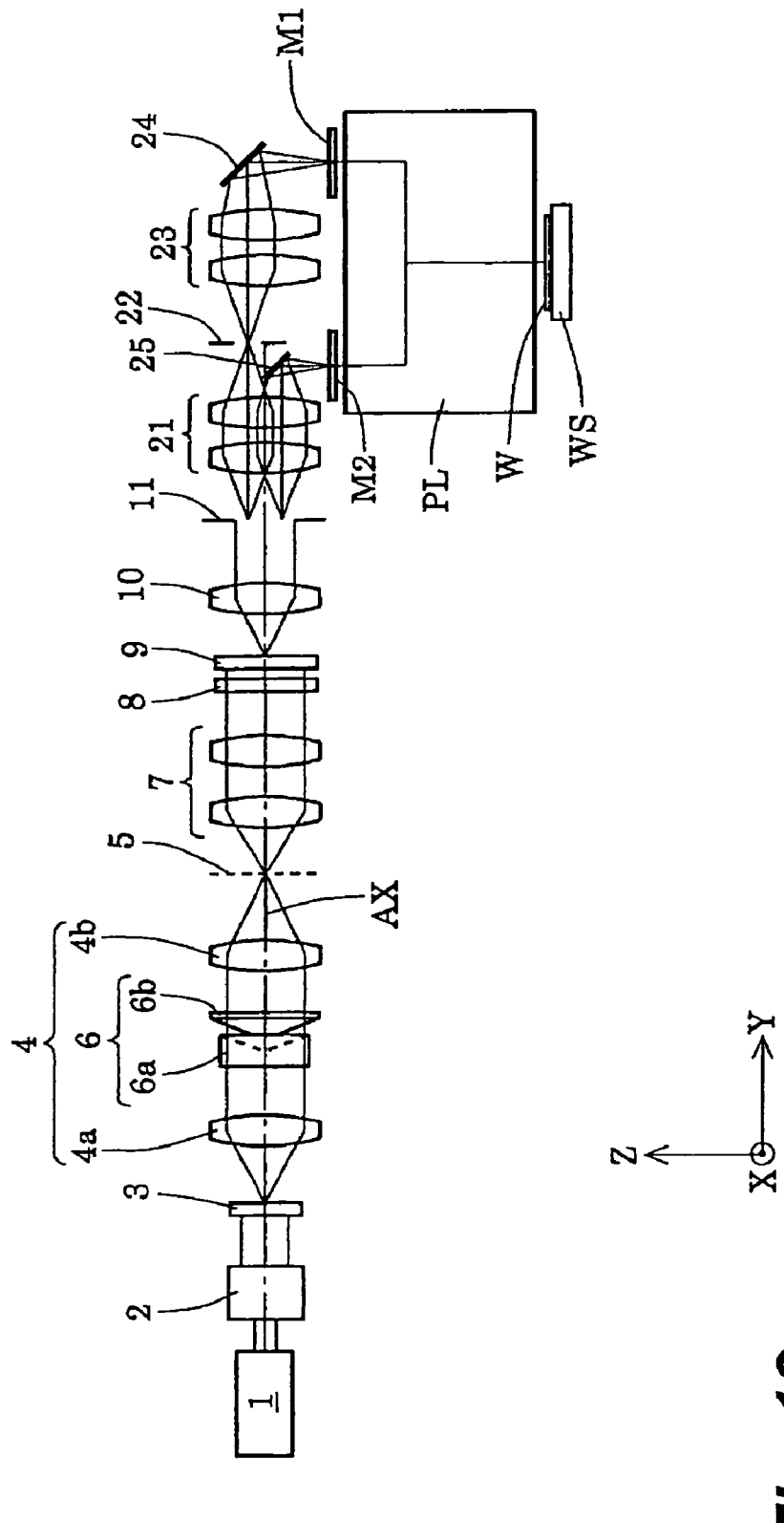
FIG. 12 is a drawing schematically showing a configuration of an exposure apparatus according to a second modification example of the embodiment of the present invention.

In the second modification example of FIG. 12, the first beams incident to the lower (−Z-direction side) half regions in the entrance faces 9aa of the respective micro-lenses 9a of the micro fly's eye lens 9 travel via the condenser optical system 10, mask blind 11, and imaging optical system 21 to superposedly illuminate a second mask blind 22. On the second mask blind 22, similarly as on the mask blind 11, a rectangular illumination field is also formed. The first beams having passed through the rectangular aperture of the second mask blind 22 travel via an imaging optical system 23 and a path folding reflector 24 to illuminate the first illumination region IR1 of a rectangular shape elongated in the X-direction in the pattern region on the first mask M1.

On the other hand, the second beams incident to the upper (+Z-direction side) half regions in the entrance faces 9aa of the respective micro-lenses 9a of the micro fly's eye lens 9 travel via the condenser optical system 10, mask blind 11, imaging optical system 21, and path folding reflector 25 to illuminate the second illumination region IR2 of the rectangular shape elongated in the X-direction in the pattern region on the second mask M2. In the second modification example, while the first mask M1, the second mask M2, and the wafer W are synchronously moved along the Y-direction with respect to a double-headed projection optical system PL having two mutually separated effective view fields and one effective imaging region, a synthetic pattern is formed in one shot area on the wafer W by scanning exposures of the pattern of the first mask M1 and the pattern of the second mask M2 in a superimposed state.

Figure 13:
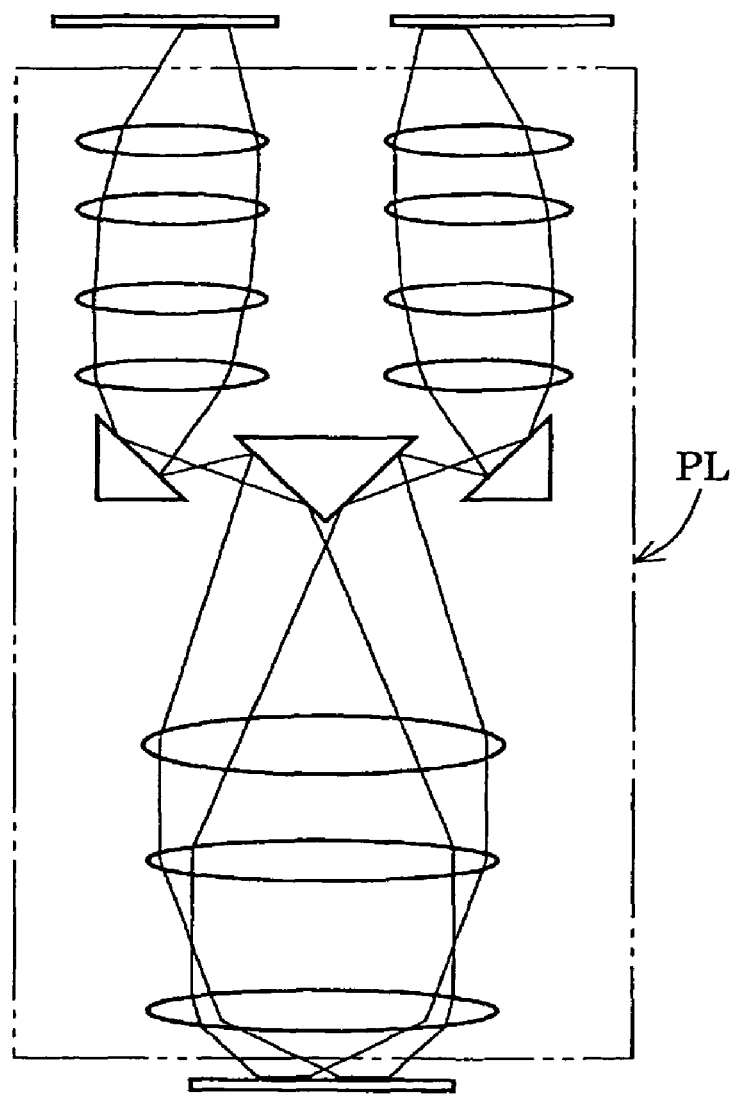
FIG. 13 is a drawing schematically showing a configuration of a double-headed projection optical system consisting of a refracting system and folding mirrors.
Figure 14:
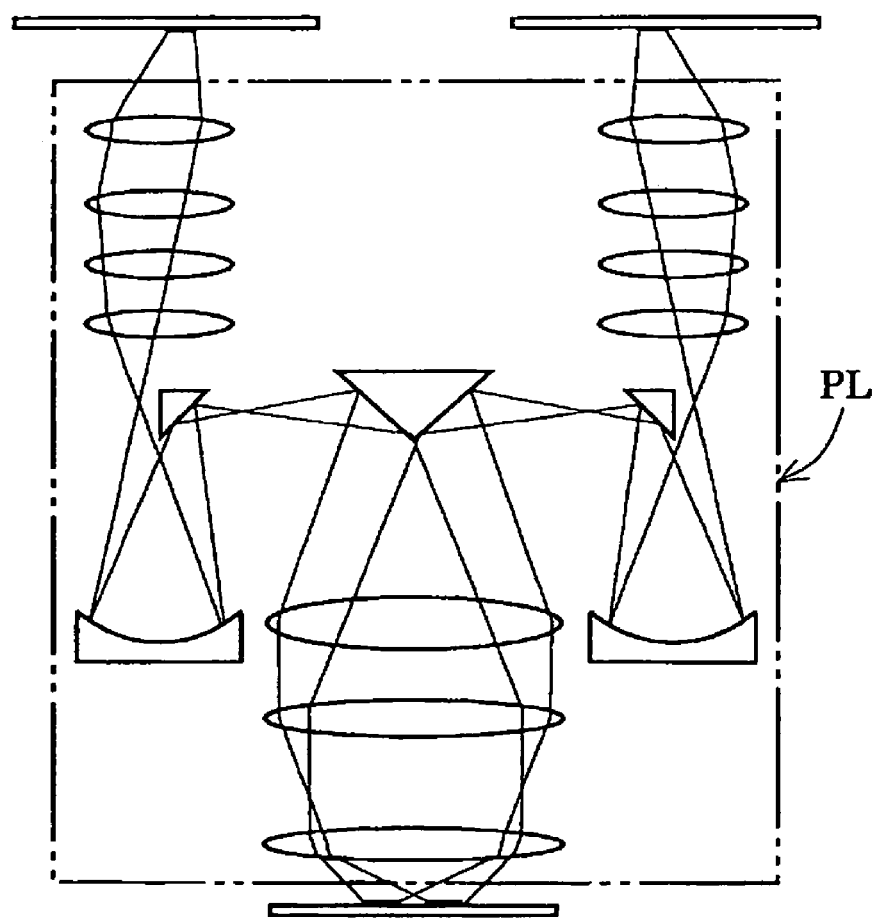
FIG. 14 is a drawing schematically showing a configuration of a catadioptric double-headed projection optical system.
Figure 15:
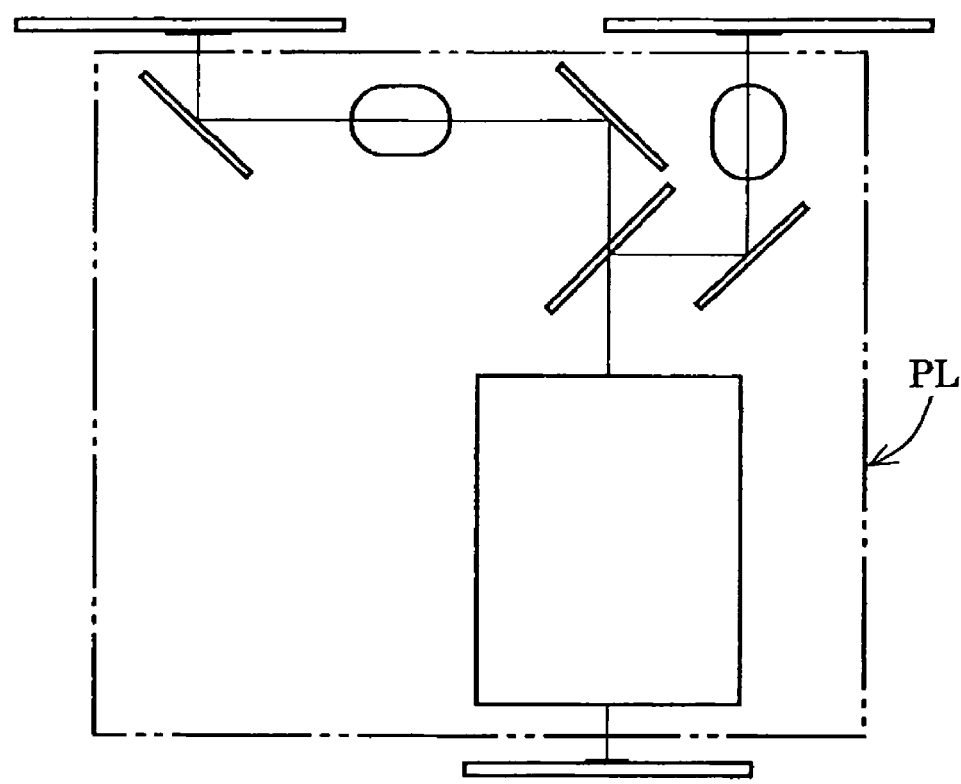
FIG. 15 is a drawing schematically showing a configuration of a double-headed projection optical system using beam splitters.

Then the wafer W is two-dimensionally stepped along the XY plane with respect to the projection optical system PL, and the above-described double scanning exposures are repeated to sequentially form the synthetic pattern of the pattern of the first mask M1 and the pattern of the second mask M2 in each shot area on the wafer W. The double-headed projection optical system PL can be, for example, a double-headed projection optical system PL consisting of a refracting system and folding mirrors as shown in FIG. 13, a catadioptric double-headed projection optical system PL as shown in FIG. 14, or a double-headed projection optical system PL using beam splitters as shown in FIG. 15. Such double-headed projection optical systems applicable herein can be the optical systems proposed in U.S. Pat. Provisional Application No. 60/907,828 and U.S. patent application Ser. No. 12/050,903 corresponding thereto and filed on Mar. 18, 2008. The teachings of U.S. patent application Ser. No. 12/050,903 are incorporated herein by reference.

In the above-described embodiment and each modification example, the present invention was explained in association with the double exposures to form one synthetic pattern by superimposing two types of patterns in a single shot area on the photosensitive substrate (wafer). However, without having to be limited to this, the present invention can also be applied similarly to multiple exposures to form one synthetic pattern by superimposing three or more types of patterns in a single shot area on the photosensitive substrate.

The illumination optical apparatus and exposure apparatus according to the foregoing embodiment are manufactured by assembling various sub-systems containing their respective components as set forth in the scope of claims in the present application, so as to maintain predetermined mechanical accuracy, electrical accuracy, and optical accuracy. For ensuring these various accuracies, the following adjustments are carried out before and after the assembling: adjustment for achieving the optical accuracy for various optical systems; adjustment for achieving the mechanical accuracy for various mechanical systems; adjustment for achieving the electrical accuracy for various electrical systems. The assembling steps from the various sub-systems into the exposure apparatus include mechanical connections, wire connections of electric circuits, pipe connections of pneumatic circuits, etc. between the various sub-systems. It is needless to mention that there are assembling steps of the individual sub-systems, before the assembling steps from the various sub-systems into the exposure apparatus. After completion of the assembling steps from the various sub-systems into the exposure apparatus, overall adjustment is carried out to ensure various accuracies as the entire exposure apparatus. The manufacture of exposure apparatus is desirably performed in a clean room in which the temperature, cleanliness, etc. are controlled.

The exposure apparatus according to the above-described embodiment can be used to manufacture micro devices (semiconductor devices, imaging devices, liquid-crystal display devices, thin-film magnetic heads, etc.) through a process of illuminating a mask (reticle) by the illumination optical apparatus (illumination block) and effecting an exposure of a transfer pattern formed on a mask, on a photosensitive substrate by the projection optical system (exposure block). The below will describe an example of a method of manufacturing semiconductor devices as micro devices by forming a predetermined circuit pattern on a wafer or the like as a photosensitive substrate by means of the exposure apparatus of the above embodiment, with reference to the flowchart of FIG. 16.

Figure 16:
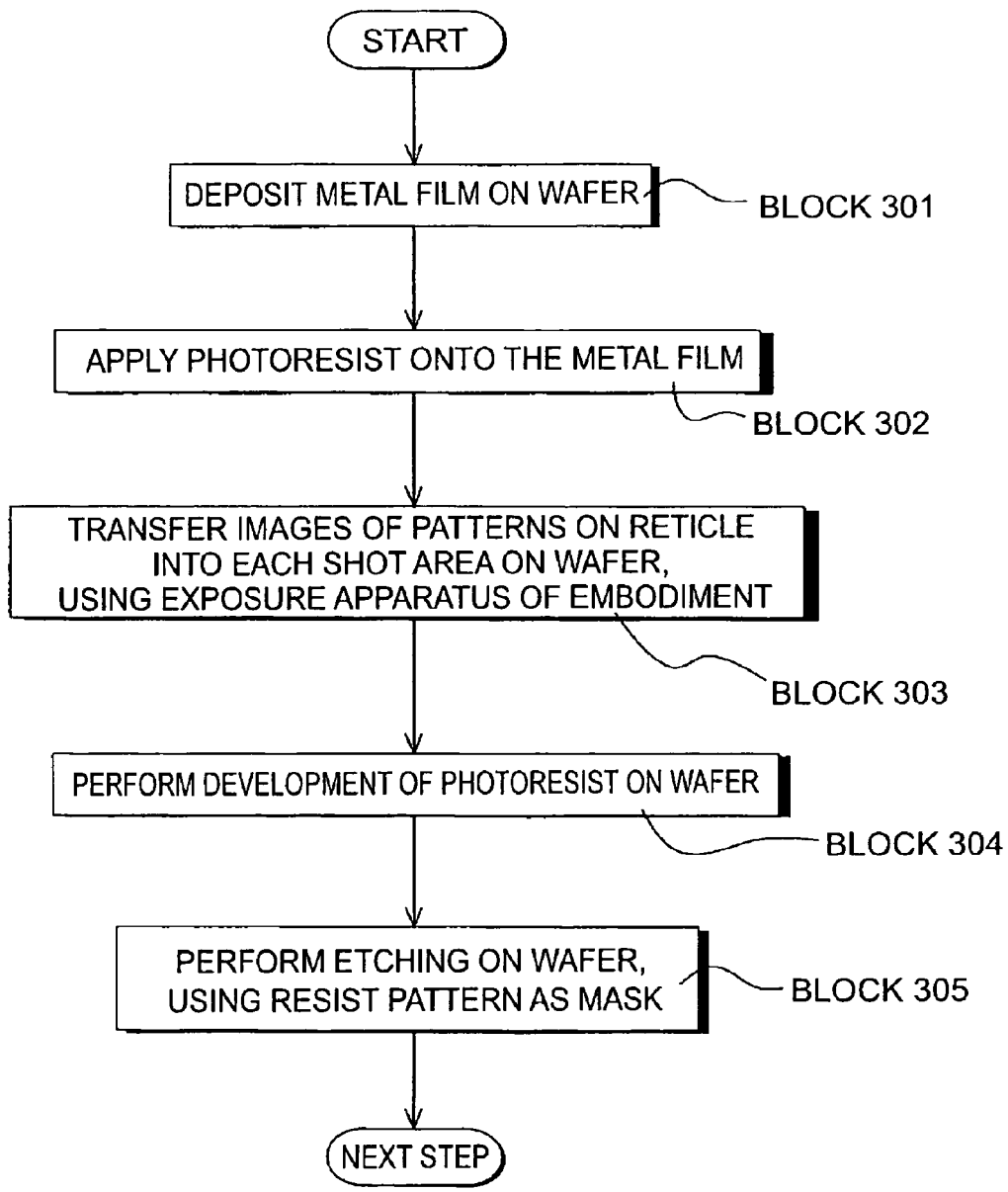
FIG. 16 is a flowchart showing a method for manufacturing semiconductor devices as micro devices.

The first block 301 in FIG. 16 is to deposit a metal film on each wafer in one lot. The next block 302 is to apply a photoresist onto the metal film on each wafer in the lot. The subsequent block 303 is to use the exposure apparatus of the above embodiment to sequentially transfer images of patterns on a mask into each shot area on each wafer in the lot through the projection optical system of the exposure apparatus. The subsequent block 304 is to perform development of the photoresist on each wafer in the lot and the next block 305 is to perform etching using the resist pattern as a mask on each wafer in the lot, and thereby to form a circuit pattern corresponding to the patterns on the mask, in each shot area on each wafer.

Thereafter, devices such as semiconductor devices are manufactured through blocks including formation of circuit patterns in upper layers. The above-described semiconductor device manufacturing method permits us to obtain the semiconductor devices with extremely fine circuit patterns at high throughput. The blocks 301-305 are arranged to perform the respective blocks of deposition of metal on the wafer, application of the resist onto the metal film, exposure, development, and etching, but it is needless to mention that the process may be modified as follows: prior to these blocks, an oxide film of silicon is formed on the wafer, a resist is then applied onto the silicon oxide film, and thereafter the blocks of exposure, development, and etching are carried out.

Figure 17:
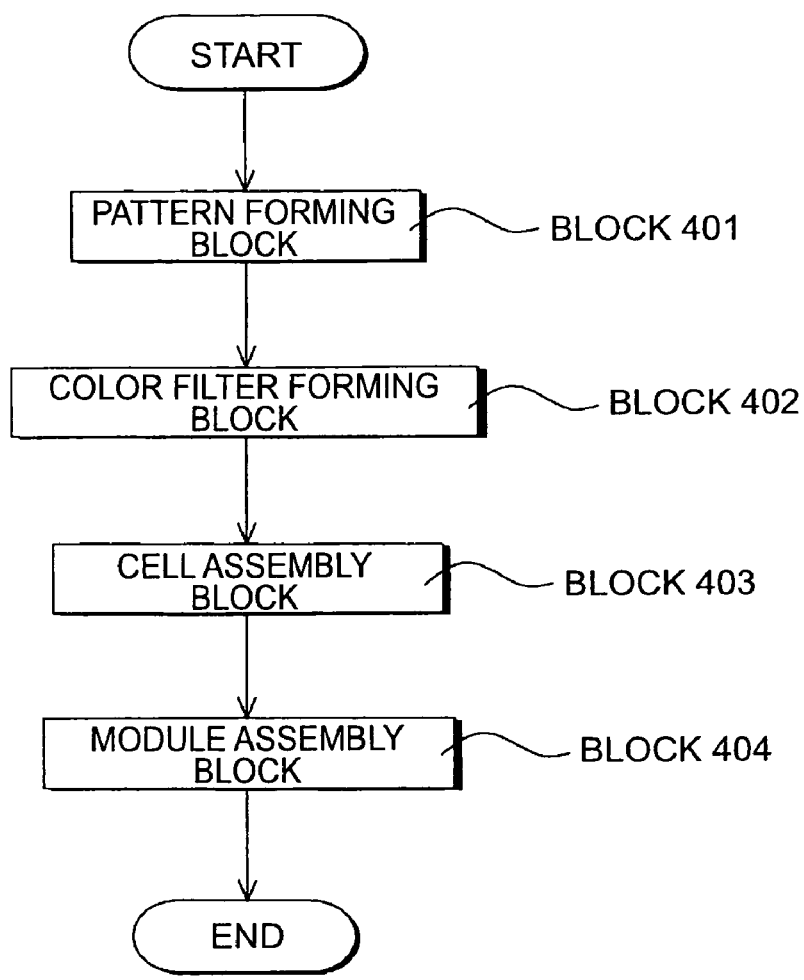
FIG. 17 is a flowchart of a method for manufacturing a liquid-crystal display device as a micro device.

The exposure apparatus of the above embodiment can also be used to manufacture a liquid-crystal display device as a micro device by forming predetermined patterns (circuit pattern, electrode pattern, etc.) on plates (glass substrates). An example of a method in this case will be described below with reference to the flowchart of FIG. 17. In FIG. 17, a pattern forming block 401 is to execute the so-called photolithography block of transferring patterns on a mask onto a photosensitive substrate (a glass substrate coated with a resist or the like) by means of the exposure apparatus of the above embodiment. This photolithography block results in forming a predetermined pattern including a large number of electrodes and others on the photosensitive substrate. Thereafter, the exposed substrate is processed through each of blocks including a development block, an etching block, a resist removing block, etc. whereby the predetermined pattern is formed on the substrate, followed by the next color filter forming block 402.

The next color filter forming block 402 is to form a color filter in which a large number of sets of three dots corresponding to R (Red), (Green), and B (Blue) are arrayed in a matrix pattern or in which sets of filters of three stripes of R, G, and B are arrayed in the horizontal scan line direction. After the color filter forming block 402, a cell assembling block 403 is executed. The cell assembling block 403 is to assemble a liquid crystal panel (liquid crystal cell) using the substrate with the predetermined pattern obtained in the pattern forming block 401, the color filter obtained in the color filter forming block 402, and others.

In the cell assembling block 403, the liquid crystal panel (liquid crystal cell) is manufactured, for example, by pouring a liquid crystal into between the substrate with the predetermined pattern obtained in the pattern forming block 401 and the color filter obtained in the color filter forming block 402. The subsequent module assembling block 404 is to attach various components such as electric circuits and backlights for display operation of the assembled liquid crystal panel (liquid crystal cell) to complete the liquid-crystal display device. The above-described manufacturing method of the liquid-crystal display device permits us to obtain the liquid-crystal display device with extremely fine circuit patterns at high throughput.

The aforementioned embodiment used the KrF excimer laser light or the ArF excimer laser light as the light source, but the present invention does not have to be limited to these: the present invention can also be applied to the exposure apparatus using any other appropriate laser light source, e.g., an $F_2$ laser light source. The aforementioned embodiment described the present invention using the example of illumination optical apparatus mounted on the exposure apparatus and adapted to illuminate the mask, but it is apparent that the present invention can be applied to the generally-used illumination optical apparatus for illuminating any surface to be illuminated other than the mask.

Since the illumination optical apparatus of the embodiment of the present invention comprises the polarization changing member for changing the polarization state of at least one beam out of the first beam incident to the first region and the second beam incident to the second region in the wavefront division regions of the optical integrator, it is able to quickly perform the switching between polarization states of illumination light in a first illumination region formed on the surface to be illuminated by the first beam and in a second illumination region formed on the surface to be illuminated by the first beam. As a consequence, the exposure apparatus of the embodiment of the present invention is able to perform the exposure of the microscopic pattern on the photosensitive substrate by the double exposure method at high throughput and, therefore, to manufacture good devices at high throughput, using the illumination optical apparatus capable of quickly performing the switching between polarization states of the illumination light in the first region and in the second region.

The invention is not limited to the foregoing embodiments but various changes and modifications of its components may be made without departing from the scope of the present invention. Also, the components disclosed in the embodiments may be assembled in any combination for embodying the present invention. For example, some of the components may be omitted from all components disclosed in the embodiments. Further, components in different embodiments may be appropriately combined.

The invention claimed is:

1. An illumination optical apparatus that illuminates a surface to be illuminated, comprising:
    an optical integrator arranged in an optical path of the illumination optical apparatus and including a plurality of wavefront division regions;
    a polarization changing member arranged in a beam path of the illumination optical apparatus and which changes a polarization state of at least one beam out of a beam incident to a first region in the plurality of wavefront division regions of the optical integrator and a beam incident to a second region in the plurality of wavefront division regions of the optical integrator; and
    a field stop arranged at or near a position optically conjugate with the surface to be illuminated and operated in a first mode or a second mode, wherein the field stop passes a first beam which passed through the first region in the plurality of wavefront division regions and shades a second beam which passed through the second region in the plurality of wavefront division regions in the first mode, and the field stop passes the second beam and shades the first beam in the second mode.

2. The illumination optical apparatus according to claim 1, wherein the polarization changing member is located immediately before an entrance surface of the optical integrator and includes a plurality of first optical elements corresponding to the first region and a plurality of second optical elements corresponding to the second region.

3. The illumination optical apparatus according to claim 1, wherein each of the plurality of the wavefront division regions comprises the first region and the second region, and the polarization changing member changes a polarization state of at least one beam out of a beam incident to the first region in each of the plurality of wavefront division regions and a beam incident to the second region in each of the plurality of wavefront division regions.

4. The illumination optical apparatus according to claim 1, wherein the plurality of wavefront division regions include a first wavefront division region and a second wavefront division region, the polarization changing member includes a first polarization changing member arranged in a first beam path of a first beam incident to the first wavefront division region and a second polarization changing member arranged in a second beam path of a second beam incident to the second wavefront division region, the first polarization changing member changes a polarization state of at least one beam out of a beam incident to a first region in the first wavefront division region and a beam incident to a second region in the first wavefront division region, and the second polarization changing member changes a polarization state of at least one beam out of a beam incident to a third region in the second wavefront division region and a beam incident to a fourth region in the second wavefront division region.

5. The illumination optical apparatus according to claim 1, wherein a first illumination region is formed on the surface to be illuminated, based on the first beam having passed through the first region in the plurality of wavefront division regions, and a second illumination region is formed on the surface to be illuminated, based on the second beam having passed through the second region in the plurality of wavefront division regions.

6. The illumination optical apparatus according to claim 5, wherein illumination light is guided to a projection optical system for projecting a pattern image of a first mask illuminated with light incident to the first illumination region and a pattern image of a second mask illuminated with light incident to the second illumination region, in proximity or in superposition on a predetermined surface.

7. The illumination optical apparatus according to claim 6, wherein the first illumination region is formed in a first pattern region arranged on the surface to be illuminated, and the second illumination region is formed in a second pattern region adjacent along a first direction to the first pattern region on the surface to be illuminated.

8. The illumination optical apparatus according to claim 7, which is used in an exposure apparatus for transferring patterns in the first and second pattern regions into first and second sectional regions respectively adjacent on a substrate by a single scanning exposure, while illuminating the first and second pattern regions with the first and second beams respectively.

9. The illumination optical apparatus according to claim 1, comprising a light source for supplying illumination light to the optical integrator.

10. The illumination optical apparatus according to claim 1, comprising:

a first lightguide optical system, arranged between the optical integrator and the surface to be illuminated, which guides the first beam having passed through the first region in the plurality of wavefront division regions, to a first illumination region on the surface to be illuminated; and a second lightguide optical system, arranged between the optical integrator and the surface to be illuminated, which guides the second beam having passed through the second region in the plurality of wavefront division regions, to a second illumination region on the surface to be illuminated.

11. The illumination optical apparatus according to claim 10, comprising a distribution changing member arranged at or near a position optically conjugate with the surface to be illuminated and adapted to change a light quantity distribution in angle directions of at least one beam out of the first beam incident to the first illumination region and the second beam incident to the second illumination region.

12. The illumination optical apparatus according to claim 11, wherein the distribution changing member includes a first diffractive optical element for dividing the first beam into two beams and deflecting the two beams at mutually identical angles and along a first plane, and a second diffractive optical element for dividing the second beam into two beams and deflecting the two beams at mutually identical angles and along a second plane perpendicular to the first plane.

13. The illumination optical apparatus according to claim 12, wherein the polarization changing member is located immediately before an entrance surface of the optical integrator and includes a plurality of first optical elements corresponding to the first region and a plurality of second optical elements corresponding to the second region.

14. The illumination optical apparatus according to claim 13, wherein each of the plurality of the wavefront division regions comprises the first region and the second region, and the polarization changing member changes a polarization state of at least one beam out of a beam incident to the first region in each of the plurality of wavefront division regions and a beam incident to the second region in each of the plurality of wavefront division regions.

15. The illumination optical apparatus according to claim 13, wherein the plurality of wavefront division regions include a first wavefront division region and a second wavefront division region, the polarization changing member includes a first polarization changing member arranged in a first beam path of a first beam incident to the first wavefront division region and a second polarization changing member arranged in a second beam path of a second beam incident to the second wavefront division region, the first polarization changing member changes a polarization state of at least one beam out of a beam incident to a first region in the first wavefront division region and a beam incident to a second region in the first wavefront division region, and the second polarization changing member changes a polarization state of at least one beam out of a beam incident to a third region in the second wavefront division region and a beam incident to a fourth region in the second wavefront division region.

16. The illumination optical apparatus according to claim 12, wherein a first illumination region is formed on the surface to be illuminated, based on the first beam having passed through the first region in the plurality of wavefront division regions, and a second illumination region is formed on the surface to be illuminated, based on the second beam having passed through the second region in the plurality of wavefront division regions.

17. The illumination optical apparatus according to claim 16, wherein illumination light is guided to a projection optical system for projecting a pattern image of a first mask illuminated with light incident to the first illumination region and a pattern image of a second mask illuminated with light incident to the second illumination region, in proximity or in superposition on a predetermined surface.

18. The illumination optical apparatus according to claim 16, wherein the first illumination region is formed in a first pattern region arranged on the surface to be illuminated, and the second illumination region is formed in a second pattern region adjacent along a first direction to the first pattern region on the surface to be illuminated.

19. The illumination optical apparatus according to claim 18, which is used in an exposure apparatus for transferring patterns in the first and second pattern regions into first and second sectional regions respectively adjacent on a substrate by a single scanning exposure, while illuminating the first and second pattern regions with the first and second beams respectively.

20. The illumination optical apparatus according to claim 12, comprising a light source for supplying illumination light to the optical integrator.

21. The illumination optical apparatus according to claim 1, wherein a first illumination region is formed on the surface to be illuminated, based on the first beam having passed through the first region in the plurality of wavefront division regions, and a second illumination region is formed on the surface to be illuminated, based on the second beam having passed through the second region in the plurality of wavefront division regions.

22. The illumination optical apparatus according to claim 21, wherein illumination light is guided to a projection optical system for projecting a pattern image of a first mask illuminated with light incident to the first illumination region and a pattern image of a second mask illuminated with light incident to the second illumination region, in proximity or in superposition on a predetermined surface.

23. The illumination optical apparatus according to claim 21, wherein the first illumination region is formed in a first pattern region arranged on the surface to be illuminated, and the second illumination region is formed in a second pattern region adjacent along a first direction to the first pattern region on the surface to be illuminated.

24. The illumination optical apparatus according to claim 23, which is used in an exposure apparatus for transferring patterns in the first and second pattern regions into first and second sectional regions respectively adjacent on a substrate by a single scanning exposure, while illuminating the first and second pattern regions with the first and second beams respectively.

25. The illumination optical apparatus according to claim 21, comprising a light source for supplying illumination light to the optical integrator.

26. An exposure apparatus comprising the illumination optical apparatus as set forth in claim 1, and adapted to effect an exposure of a predetermined pattern illuminated by the illumination optical apparatus, on a photosensitive substrate.

27. A device manufacturing method comprising:

effecting the exposure of the predetermined pattern on the photosensitive substrate, using the exposure apparatus as set forth in claim 26; and developing the photosensitive substrate transferred on the pattern and forming a mask layer of a shape corresponding to the pattern on a surface of the photosensitive substrate; and processing the surface of the photosensitive substrate through the mask layer.

\* \* \* \* \*